(12) United States Patent
Okamoto et al.

(10) Patent No.: US 9,112,460 B2
(45) Date of Patent: Aug. 18, 2015

(54) SIGNAL PROCESSING DEVICE

(71) Applicant: SEMICONDUCTOR ENERGY LABORATORY CO., LTD., Atsugi-Shi, Kanagawa-Ken (JP)

(72) Inventors: Yuki Okamoto, Kanagawa (JP); Takayuki Ikeda, Kanagawa (JP); Yoshiyuki Kurokawa, Kanagawa (JP); Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/224,553

(22) Filed: Mar. 25, 2014

(65) Prior Publication Data

US 2014/0300403 A1      Oct. 9, 2014

(30) Foreign Application Priority Data

Apr. 5, 2013  (JP) ................................ 2013-079299
Apr. 18, 2013 (JP) ................................ 2013-087384

(51) Int. Cl.
*H03K 3/00* (2006.01)
*H03F 3/45* (2006.01)
(Continued)

(52) U.S. Cl.
CPC ............ *H03F 3/45076* (2013.01); *H03F 1/223* (2013.01); *H03F 3/45179* (2013.01); *H03F 3/45183* (2013.01); *H03F 3/45237* (2013.01); *H03K 19/018528* (2013.01); *H03F 2203/45394* (2013.01); *H03F 2203/45518* (2013.01); *H03F 2203/45674* (2013.01)

(58) Field of Classification Search
USPC ......................................................... 327/108
See application file for complete search history.

(56) References Cited

U.S. PATENT DOCUMENTS 5,376,845 A  *  12/1994  Ovens et al. .................... 326/66
5,731,856 A      3/1998  Kim et al.
(Continued)

FOREIGN PATENT DOCUMENTS

EP      1737044 A     12/2006
EP      2226847 A      9/2010
(Continued)

OTHER PUBLICATIONS

Yuji Osaki et al.; "A Low-Power Level Shifter With Logic Error Correction for Extremely Low-Voltage Digital CMOS LSIs"; IEEE Journal of Solid-State Circuits, vol. 47, No. 7; pp. 1776-1783; Jul. 1, 2012.

(Continued)

*Primary Examiner* — Daniel Puentes
(74) *Attorney, Agent, or Firm* — Fish & Richardson P.C.

(57) ABSTRACT

A level shifter converting a binary signal having a first potential and a second potential into a signal having the first potential and a third potential, and a signal processing circuit using the level shifter are provided. The first potential is higher than the second potential. The second potential is higher than the third potential. The potential difference between the first potential and the third potential may be more than or equal to 3 V and less than 4 V. The level shifter includes a current control circuit which generates a second signal for operating an amplifier circuit for a certain period in accordance with the potential change of the first signal which is input to the amplifier circuit. The output of level shifter is input to a gate of an N-channel transistor whose threshold voltage is lower than 0 V.

14 Claims, 20 Drawing Sheets

(51) Int. Cl.
*H03K 19/0185* (2006.01)
*H03F 1/22* (2006.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,501,876 B2 | 3/2009 | Kimura |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063287 A1 | 3/2007 | Sano et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0121878 A1 | 5/2011 | Kato et al. |
| 2011/0134683 A1 | 6/2011 | Yamazaki et al. |
| 2011/0175646 A1 | 7/2011 | Takemura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID Internatioanal Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic NANO-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, Or Al; B: Mg, Mn, Fe, Ni, Cu,Or Zn] at temperatures over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

US 9,112,460 B2

SIGNAL PROCESSING DEVICE

BACKGROUND OF THE INVENTION

1. Field of the Invention

This disclosure relates to a signal processing device.

2. Description of the Related Art

A semiconductor integrated circuit operable with a low power voltage has been developed in order to lower power consumption. Meanwhile, the semiconductor integrated circuit includes a plurality of circuit blocks performing diverse functions and thus plural kinds of power supply voltage are needed for these circuit blocks.

In the case where transistors using different semiconductors are combined in one circuit block or in the case where in a circuit composed of transistors using the same semiconductors, their driving methods or their required characteristics are different, plural kinds of power supply voltage are sometimes needed.

Further, a power supply voltage different from that in an internal circuit is sometimes needed because a signal level of an input/output terminal connected to the outside of the semiconductor integrated circuit depends on the characteristics of an element to be connected.

Thus, plural kinds of power supply voltage are supplied to the semiconductor integrated circuit, and a circuit unit for converting a signal level, which is called level shifter, is provided in a portion over the chip where regions using different power supply voltages are in contact with each other or an output portion (e.g., Patent Document 1 and Non-Patent Document 1).

The level shifter disclosed in Non-Patent Document 1 is shown in FIG. 20. A level shifter 400 is composed of a total of 14 transistors (transistors 401 to 414). The level shifter 400 is supplied with a signal IN and an inverted single INB of the signal IN, which are low-voltage signals.

The amplitude of the signal IN and the inverted signal INB is VDD1-GND. OUT is a high-voltage signal which is output from the level shifter and whose amplitude is VDD2-GND. Note that VDD1 is a high potential used in a low-voltage circuit (e.g., internal circuit) and is higher than GND and lower than VDD2 (i.e., GND<VDD1<VDD2).

The level shifter 400 is a differential amplifier circuit composed of the transistors 408 to 411 and converts the amplitude of the signal IN from VDD1-GND to VDD2-GND. Because a low potential is GND in the differential amplifier circuit of the level shifter 400, if the amplitude voltage of the signal IN is lower than the absolute value of the threshold voltage of the transistors 408 to 411 (hereinafter, "threshold voltage" means "the absolute value of the threshold voltage" unless otherwise specified), there are problems of unstable amplification, the increase of noise effect, inability to convert signal at high speed, generation of leakage current, and the increase in power consumption.

PATENT DOCUMENT

[Patent Document 1] U.S. Pat. No. 7,501,876
[Patent Document 2] United States Patent Application Publication No. 2011/0121878
[Patent Document 3] United States Patent Application Publication No. 2011/0134683
[Patent Document 4] United States Patent Application Publication No. 2011/0175646
[Patent Document 5] United States Patent Application Publication No. 2007/0063287

NON-PATENT DOCUMENT

Y. Osaki, T. Hirose, N. Kuroki, M. Numa, "A Low-Power Level Shifter With Logic Error Correction for Extremely Low-Voltage Digital CMOS LSIs" IEEE Journal of Solid-State Circuits, July 2012, vol. 47, no. 7, pp. 1776-1783.

SUMMARY OF THE INVENTION

A novel signal processing circuit or the like, a driving method thereof or the like, or a novel electronic device or the like, driving method thereof or the like is provided.

A signal processing device includes an amplifier circuit and a current control circuit. The amplifier circuit amplifies and outputs a first signal that is input to the amplifier circuit. Power supply to the amplifier circuit is controlled by the second signal. The current control circuit generates a second signal in a period during which a phase of the first signal is different from a phase of a third signal which is delayed compared to the first signal. The first signal is a binary signal whose high potential is a first potential and low potential is a second potential. A high potential and a low potential of a power supply of the amplifier circuit are a third potential and a fourth potential, respectively. The third potential is higher than or equal to the first potential. The fourth potential is lower than the second potential. The third potential is equal to the first potential. A difference between the first potential and the second potential is smaller than a minimum value of an absolute value of a threshold voltage of a transistor included in the amplifier circuit. An output of the amplifier circuit is input to the current control circuit as the second signal. The output of the amplifier circuit is input to a latch circuit. The amplifier circuit is a differential amplifier circuit. The signal processing device further includes a transistor whose threshold voltage is lower than 0 V and on-off ratio is $10^{14}$ or more. A gate of the transistor is supplied with a binary signal having the third potential and the fourth potential. One of a source and a drain of the transistor is supplied with a binary signal having the first potential and the second potential. The transistor includes an oxide semiconductor in a channel.

For example, power consumption can be reduced. If a power supply voltage of a low-voltage circuit is smaller than the threshold voltage of a transistor which is used, boosting (amplification) can be performed stably. By using the signal processing device in a programmable logic device (PLD) or the like, a flexible signal processing circuit whose circuit configuration can be optionally changed can be obtained. Note that the effects are described in detail below without limitation thereto.

DETAILED DESCRIPTION OF THE INVENTION

Hereinafter, embodiments will be described in detail with reference to the accompanying drawings. However, the embodiments are not limited to the following description, and it will be easily understood by those skilled in the art that various changes can be made to the embodiment and details thereof without departing from the spirit and the scope. Therefore, the description disclosed in this disclosure is not interpreted as being limited to the description of Embodiments below.

Although only a basic connection relation is described below to simplify a circuit configuration, for making a more developed or redundant structure or for another reason, a structure in which one element or a plurality of elements is included between a terminal of one element and a terminal of another element (i.e., a structure in which one element is connected indirectly to the other element) is possible without departing from the basic connection relation. In other words, connection between a terminal of one element and a terminal of the other element includes both direct connection and indirect connection.

Each of the embodiments described below can be implemented in appropriate combination with any of the other embodiments.

(Embodiment 1)

In this embodiment, some embodiments of a level shifter will be described.

Figure 1A:
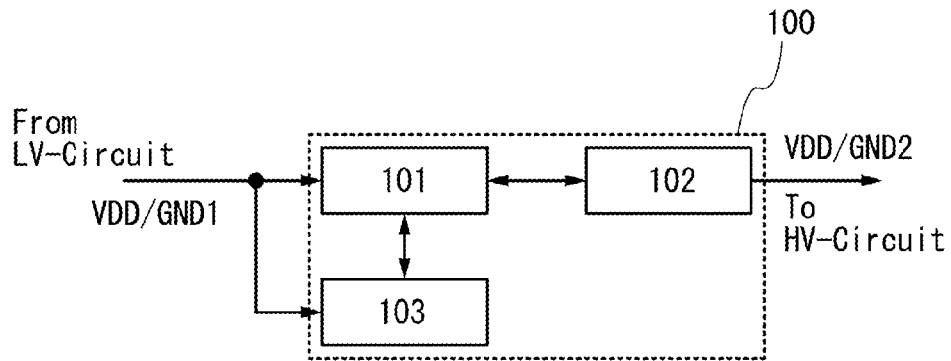
FIGS. 1A to 1C illustrate structure examples of a level shifter.

FIG. 1A is a block diagram of a level shifter 100. The level shifter 100 includes an amplifier circuit region 101, a latch circuit 102, and a current control circuit 103. In the amplifier circuit region 101, the latch circuit 102, and the current control circuit 103, a high potential is VDD and a low potential is GND2.

A signal is input from a low-voltage circuit (LV-Circuit) to the amplifier circuit region 101 and the current control circuit 103, and the potential of this signal is higher than or equal to GND1 and lower than or equal to VDD (GND2<GND1<VDD). A difference between GND2 and GND1 may be larger than the threshold voltage of a transistor which is used. In addition, the relation of VDD-GND1<GND1-GND2 is possible, for example.

Output of the circuits included in the level shifter 100 often serves as input of the other circuits. For example, the output of the amplifier circuit region 101 is sometimes input to the current control circuit 103, or the output of the current control circuit 103 is sometimes input to the amplifier circuit region 101. Further, it is difficult to distinguish output and input terminals of the latch circuit 102. In addition, the amplifier circuit region 101 and the latch circuit 102 can be collectively regarded as an amplifier circuit.

Figure 1B:
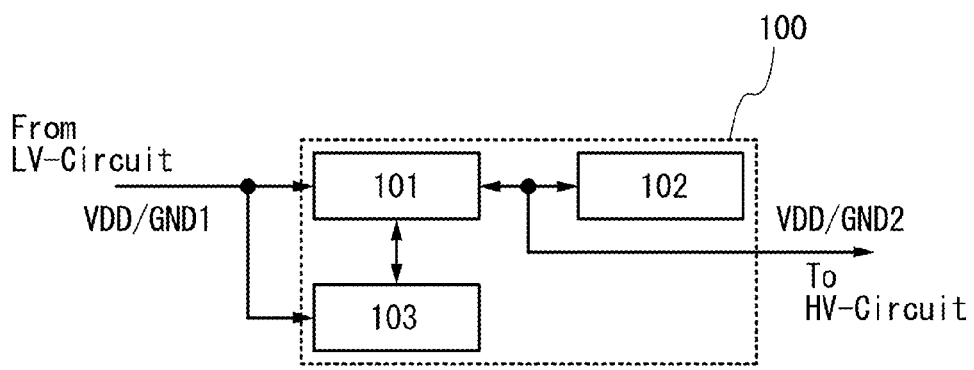

For example, not only does output of the amplifier circuit region 101 serves as input of the latch circuit 102 to be output to a high-voltage circuit (HV-Circuit) as shown in FIG. 1A, but it can be input to the latch circuit 102 and is also branched to the high-voltage circuit as shown in FIG. 1B. The level shifter 100 may have a structure other than those in FIGS. 1A and 1B.

Figure 1C:
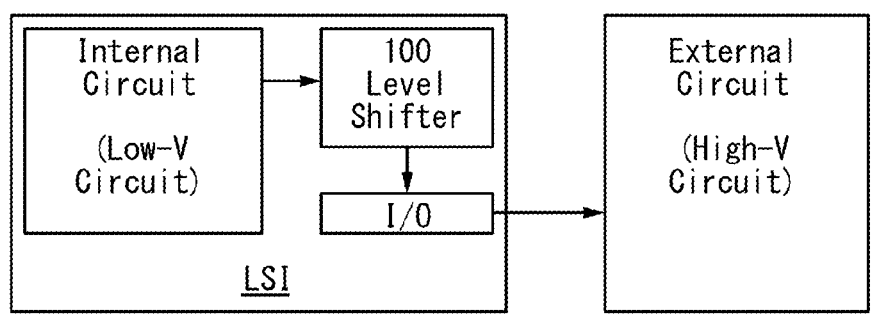

The level shifter 100 can be provided in a variety of semiconductor devices. FIG. 1C is an example of a structure of a semiconductor integrated circuit (LSI: Large Scale Integration) including the level shifter 100. The semiconductor integrated circuit includes an internal circuit operating with a power supply voltage with a low voltage (a low-voltage circuit or a low-voltage region), and an output/input portion (I/O) operating with a power supply voltage with a high voltage. A low-voltage signal transmitted from an internal circuit to the level shifter 100 is converted in the level shifter 100 and transmitted via the I/O terminal to an external circuit operating with a power voltage with a high voltage (a high-voltage circuit or a high-voltage region).

Note that the potential VDD and/or the potential GND2 are/is not only output to the outside, bus also used in an internal circuit.

Figure 2A:
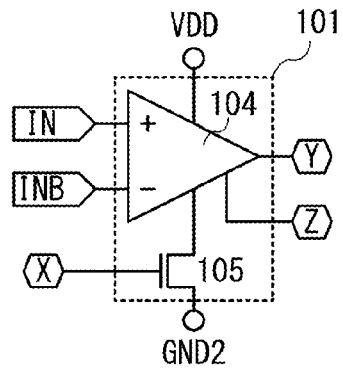
FIGS. 2A to 2F illustrate circuit examples of an amplifier circuit unit.

FIG. 2A is a circuit example of the amplifier circuit region 101 that can be used in the level shifter 100. The amplifier circuit region 101 includes a differential amplifier circuit 104 and a switch 105 for controlling power supplied to the differential amplifier circuit 104. The differential amplifier circuit 104 is supplied with VDD and GND2.

The differential amplifier circuit 104 shown in FIG. 2A is provided with at least one of or both of terminals to which the signal IN and the inverted signal INB are input from the low-voltage circuit to the differential amplifier circuit 104, and terminals X, Y, and Z. The terminal X is used to control the switch 105. An output signal of the differential amplifier circuit 104 is output from the terminal Y. An inverted signal of an output signal is often output from the differential amplifier circuit, specifically from the terminal Z.

When the differential amplifier circuit 104 operates all the time, power consumption is increased; thus, the operation is controlled with the switch 105 so that the differential amplifier circuit 104 operates only when needed. Specifically, when the input signal IN is changed from H to L or from L to H, the potential of the terminal X is changed so that the switch 105 is turned on. Note that the potential of the terminal X is higher than or equal to GND2 and lower than or equal to VDD.

Figure 2B:
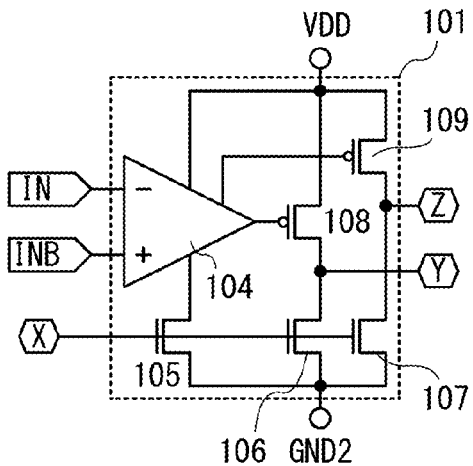

In the case where a sufficient gain cannot be obtained only by the differential amplifier circuit 104, one or both of amplifier transistors 108 and 109 shown in FIG. 2B may be provided so that each gate is connected to the output of the differential amplifier circuit 104. Also in this case, in order to reduce power consumption, a drain of the transistor 108 and a drain of the transistor 109 may be connected to a drain of an N-channel switch 106 and a drain of an N-channel switch 107, respectively, to control the supply of GND2 by the switches 106 and 107.

As the switches 105 to 107, an N-channel transistor can be used, for example. The channel widths of the switches 105 to 107 are large because they have a function of supplying power to an amplifier circuit. For example, the circuit area can be reduced by using an N-channel silicon transistor because its mobility is higher than that of a P-channel silicon transistor.

Figure 2C:
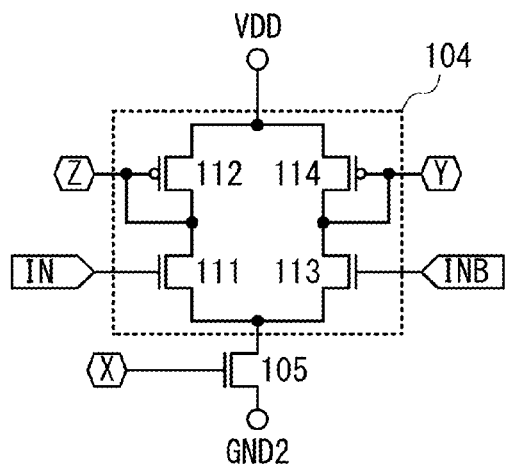

FIG. 2C is an example of the amplifier circuit region 101. The differential amplifier circuit 104 shown in FIG. 2C includes transistors 111 and 113 (both N-channel) and transistors 112 and 114 (both P-channel). The signal IN and the inverted signal INB of the signal IN are input to a gate of the transistor 111 and a gate of the transistor 113, respectively. The terminal Z is connected to each drain of the transistors 111 and 112. The terminal Y is connected to each drain of the transistors 113 and 114. The terminal Z and the terminal Y are also connected to the gate of the transistor 112 and the gate of the transistor 114, respectively. In other words, each of the transistors 112 and 114 is diode-connected and serve as a load of the differential amplifier circuit 104.

The differential amplifier circuit 104 has a function of amplifying the potential difference between the signal IN and the inverted signal INB. That is, when a potential difference between the signal IN and the inverted signal INB is VDD-GND1, a potential difference between the terminals Y and Z can be VDD-GND1 at the maximum.

When the potential of the terminal X is a potential at which the switch 105 is turned on, the potential of the signal IN is VDD, for example, and accordingly the potential of the inverted signal INB is GND1, in which case the resistance of the transistor 113 is higher than that of the transistor 111. Consequently, the potential of the terminal Y is higher than that of the terminal Z.

Figure 2D:
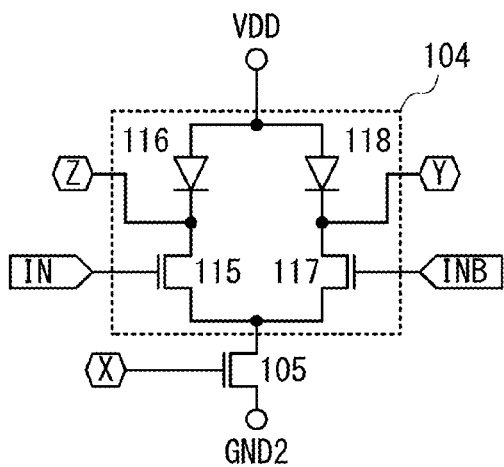

FIG. 2D is another example of the amplifier circuit region 101. The differential amplifier circuit 104 shown in FIG. 2D includes transistors 115 and 117 (both N-channel) and diodes 116 and 118. The signal IN and the inverted signal INB of the signal IN are input to a gate of the transistor 115 and a gate of the transistor 117, respectively. The terminal Z and the terminal Y are connected to a drain of the transistor 115 and a drain of the transistor 117, respectively. The diodes 116 and 118 serve as a load of the differential amplifier circuit 104.

The diode can be an N-channel transistor. The use of only transistors having the same conductivity achieves a simpler well structure than a combination of transistors having different conductivities, and thus leads to higher integration. For example, the circuit area can be reduced by using an N-channel silicon transistor because its mobility is higher than that of a P-channel silicon transistor.

Figure 2E:
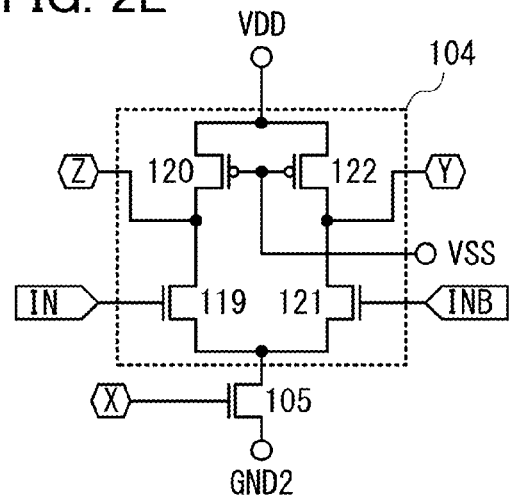

FIG. 2E is an example of the amplifier circuit region 101. The differential amplifier circuit 104 shown in FIG. 2E includes transistors 119 and 121 (both N-channel) and transistors 120 and 122 (both P-channel). The signal IN and the inverted signal INB of the signal IN are input to a gate of the transistor 119 and a gate of the transistor 121, respectively. The terminal Z is connected to each drain of the transistors 119 and 120. The terminal Y is connected to each drain of the transistors 121 and 122.

A potential VSS is applied to a gate of the transistor 120 and a gate of the transistor 122. The potential VSS is higher than GND2 and lower than VDD. For example, GND1 can be used as the potential VSS. The transistors 120 and 122 can be N-channel transistors. In any cases, VSS is set so that the transistors 120 and 122 can have appropriate resistances.

The differential amplifier circuit 104 in FIG. 2E can be driven in a wide operating range than that of the differential amplifier circuit 104 in FIG. 2C or FIG. 2D. For example, because a constant potential is always applied to the gate of the transistor 120 and the gate of the transistor 122, the potential of the terminal Y can be raised to VDD when the transistor 122 is OFF and the potential of the terminal Z can be raised to VDD when the transistor 119 is OFF. Note that the resistances of the transistors 120 and 122 can be varied depending on the level of the potential VSS and thus the amount of current flowing them can be adjusted.

Figure 2F:
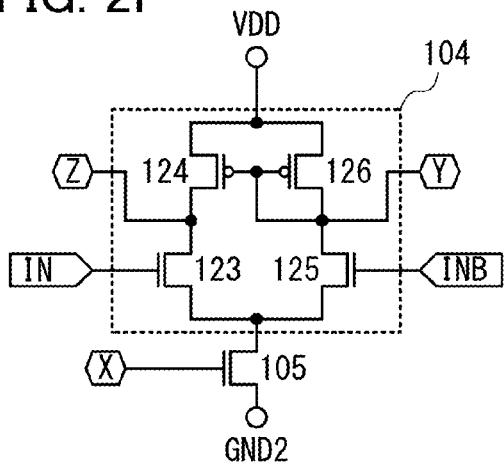

FIG. 2F is an example of the amplifier circuit region 101. The differential amplifier circuit 104 shown in FIG. 2F includes transistors 123 and 125 (both N-channel) and transistors 124 and 126 (both P-channel). The signal IN and the inverted signal INB of the signal IN are input to a gate of the transistor 123 and a gate of the transistor 125, respectively. The terminal Z is connected to each drain of the transistors 123 and 124. The terminal Y is connected to each drain of the transistors 125 and 126. The terminal Y is connected to a gate of the transistor 126, whereas the terminal Z is not connected to a gate of the transistor 124. That is, the transistors 124 and 126 form a current mirror circuit.

The differential amplifier circuits 104 shown in FIGS. 2C to 2F can be used as the differential amplifier circuit 104 included in the amplifier circuit region 101 in FIG. 2B. Note that the potentials of the terminals Y and Z of the differential amplifier circuit 104 sometimes do not rise to VDD or fall to GND2. In that case, the terminals Y and Z are connected to a latch circuit to maintain their potentials at VDD or GND2. Note that by providing a latch circuit, an output signal can be output also in a holding period during which the differential amplifier circuit 104 does not operate (this period will be described later).

Figure 3A:
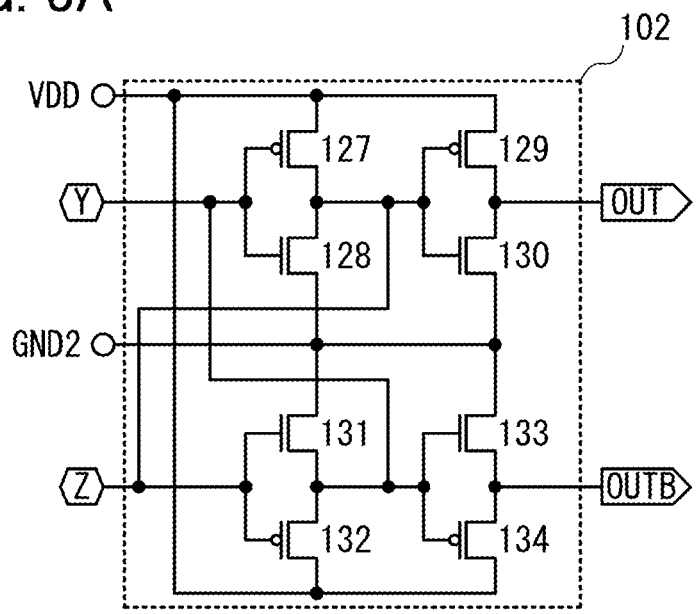
FIGS. 3A and 3B illustrate circuit examples of a latch circuit.
Figure 3B:
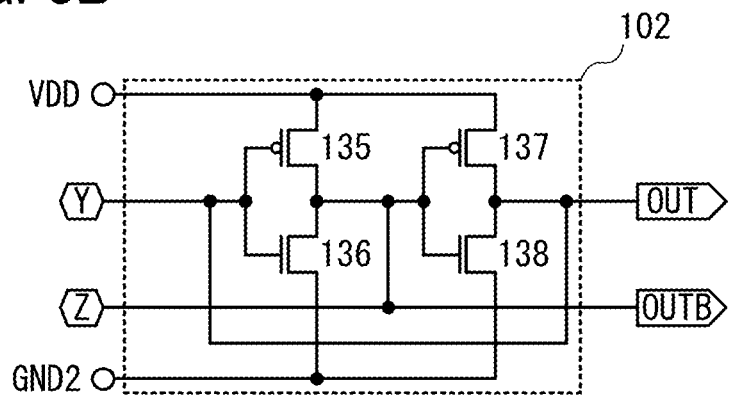

FIGS. 3A and 3B are example of the latch circuit 102.

The latch circuit 102 in FIG. 3A is composed of four inverters including transistors 127 to 134. The terminals Y and Z, which are mentioned in the description of the amplifier circuit region 101, serve as input terminals of the first-stage two inverters. In the latch circuit 102 in FIG. 3A, the output of one of the first-stage inverters is input to the other first-stage inverter and the second-stage inverter, so that a signal OUT and an inverted signal OUTB of the signal OUT are output from the second-stage inverters.

The latch circuit 102 in FIG. 3B is composed of two inverters including transistors 135 to 138. The terminals Y and Z, which are mentioned in the description of the amplifier circuit region 101, are connected to an input terminal of a first-stage inverter and an input terminal of a second-stage inverter, respectively. The output of the second-stage inverter is input to the first-stage inverter. In addition, the signal OUT and the inverted signal OUTB are output from the terminal Y and the terminal Z, respectively.

Figure 4A:
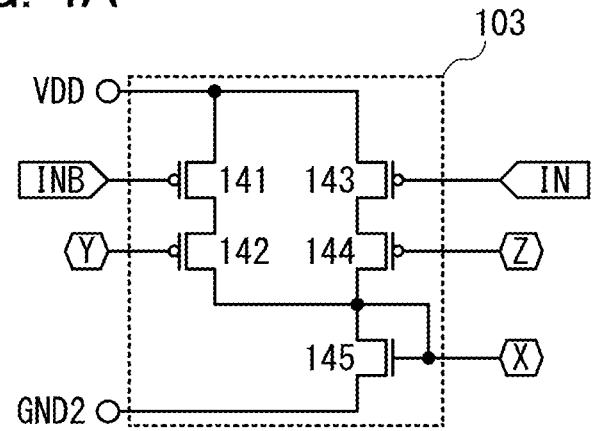
FIGS. 4A to 4C illustrate circuit examples of a current control circuit.

FIG. 4A is an example of the current control circuit 103. The current control circuit 103 in FIG. 4A includes transistors 141 to 144 (all P-channel) and a transistor 145 (N-channel). The transistors 141 and 142 are connected in series. The transistors 143 and 144 are connected in series. The potentials of sources of the transistors 141 and 143 are held at VDD. Drains of the transistors 142 and 144 are connected to a drain and a gate of the transistor 145. The drain and the gate of the transistor 145 are connected to the terminal X. The potential of a source of the transistor 145 is held at an appropriate potential, for example, GND2. The transistor 145 functions as a diode.

Note that the potential applied to the source of the transistor 145 is not limited to GND2 and can be a potential at which the transistor 145 can operate in a saturation region.

A gate of the transistor 143 and a gate of the transistor 143 are respectively supplied with the inverted signal INB and the signal IN which are input from the low-voltage circuit. A gate of the transistor 142 and a gate of the transistor 144 are connected to the terminal Y and the terminal Z, respectively.

Note that the terminals X, Y, and Z are the same as those mentioned in the description of the amplifier circuit region 101.

Note that the structure is not limited to this. It is possible to employ a structure in which the gates of the transistors 142 and 144 are respectively supplied with the signal IN and the inverted signal INB input from the low-voltage circuit, and the gates of the transistors 141 and 143 are connected to the terminals Y and Z, respectively.

While the signal IN is not changed (hereinafter, this period is referred to as holding period) in a row of the transistors 141 and 142 or a row of the transistors 143 and 144, if the signal IN is VDD, the inverted signal is GND1, the potential of the terminal Y is VDD, and the potential of the terminal Z is GND2. If the signal IN is GND1, the inverted signal INB is VDD, the potential of the terminal Y is GND2, and the potential of the terminal Z is VDD. That is, VDD is applied to either one of the gates of the two transistors in each row, so that current does not flow in the two rows. Accordingly, the potential of the terminal X is raised from GND2 by the threshold voltage of the transistor 145.

The potential of the terminal Y (or the terminal Z) corresponds to the potential of the signal IN and is output via the differential amplifier circuit 104 and the like. Thus, the potential of the terminal Y changes with respect to the signal IN after a certain period (hereinafter, this period is referred to as a transition period).

For example, the case where the potential of the signal IN changes from VDD to GND1 is described. Here, the potential of the terminal Z changes from GND2 to VDD in the above-described transition period; thus, a period during which the potential of the terminal Z remains at GND2 (or a potential close to GND2) occurs after the signal IN changes to GND1. That is, a period during which the transistors 143 and 144 are ON at the same time occurs. As a result, the potential of the terminal X is raised.

Furthermore, the case where the potential of the signal IN changes from GND1 to VDD is described. Here, the potential of the inverted signal INB changes from VDD to GND1, and the potential of the terminal Y changes from GND2 to VDD. The potential of the signal IN changes from GND1 to VDD in the transition period; thus, a period during which the potential of the terminal Y remains at GND2 (or a potential close to GND2) occurs after the inverted signal INB changes to GND1. That is, a period during which the transistors 141 and 142 are ON at the same time occurs. As a result, the potential of the terminal X is raised.

After the transition period, the holding period starts. The transistor 145 has a function of decreasing the potential of the terminal X again in the holding period, after the potential of the terminal X increases in the transition period.

In this manner, the potential of the terminal X increases only when the potential of the signal IN changes (during a certain period after the change), and after a while, the potential of the terminal X decreases and returns to the original state (before the potential change). In the amplifier circuit region 101, the switch 105 is turned on only when the potential of the terminal X increases, so that the differential amplifier circuit 104 operates. In the other periods, the differential amplifier circuit 104 does not operate; thus, current consumption can be suppressed.

Note that the current control circuit 103 is not limited to the circuit in FIG. 4A. Any circuit can be used as long as the potential of one of the terminals (e.g., the terminal X) can be changed when the signal IN (and the inverted signal INB) is changed.

The current control circuit 103 in FIG. 4A utilizes delay of the potentials of the terminals Y and Z compared to the signal IN and the inverted signal INB. The similar effect can be obtained by inputting, for example, a delay signal that is obtained by inputting the signal IN to a delay circuit (e.g., a circuit in which a plurality of inverters are connected in series), instead of the potentials of the terminals Y and Z.

Figure 4B:
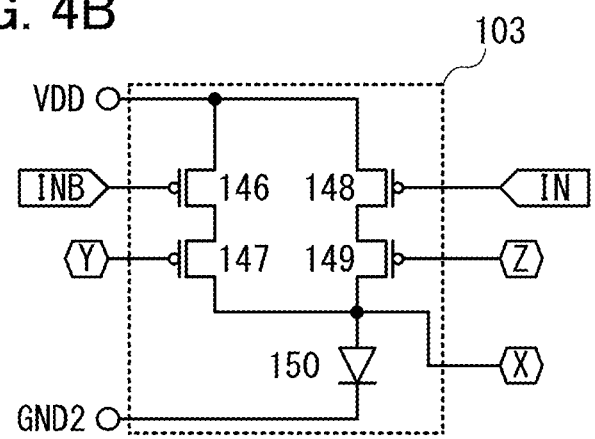

The current control circuit 103 in FIG. 4B includes transistors 146 to 149 (both P-channel) and a diode 150. The transistors 146 and 147 are connected in series. The transistors 148 and 149 are connected in series. The potentials of sources of the transistors 146 and 148 are held at VDD. Drains of the transistors 147 and 149 are connected to an anode of the diode 150 which is connected to the terminal X. The potential of a cathode of the diode 150 is held at GND2.

The diode 150 may be formed using a P-channel transistor. The use of only transistors having the same conductivity achieves a simpler well structure than a combination of transistors having different conductivities, and thus leads to higher integration. Note that current flowing through the current control circuit 103 is smaller than current flowing through the switch 105 and the like in the amplifier circuit region 101; thus, the area can be relatively reduced even when a P-channel silicon transistor is used.

Here, a gate of the transistor 146 and a gate of the transistor 148 are respectively supplied with the inverted signal INB and the signal IN which are input from the low-voltage circuit. A gate of the transistor 147 and a gate of the transistor 149 are connected to the terminal Y and the terminal Z, respectively.

Figure 4C:
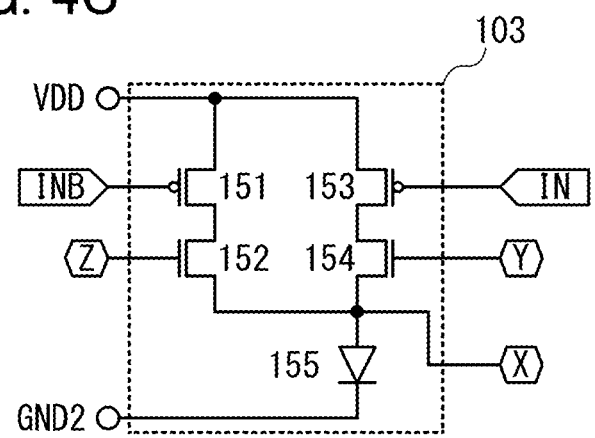

The current control circuit 103 in FIG. 4C includes transistors 151 and 153 (both P-channel), transistors 152 and 154 (both N-channel), and a diode 155. The transistors 151 and 152 are connected in series. The transistors 153 and 154 are connected in series. The potentials of sources of the transistors 151 and 153 are held at VDD. Each source of the transistors 152 and 154 is connected to an anode of the diode 155 which is connected to the terminal X. The potential of a cathode of the diode 155 is held at GND2.

Here, a gate of the transistor 151 and a gate of the transistor 153 are supplied with the inverted signal INB and the signal IN, respectively, which are input from the low-voltage circuit. A gate of the transistor 152 and a gate of the transistor 154 are connected to the terminal Z and the terminal Y, respectively.

In the current control circuit 103 in FIG. 4A or FIG. 4B, the transistors 141 to 144 and the transistors 146 to 149 are all P-channel transistors. In this case, the channel width needs to be increased because the current driving capability of P-channel transistors is poorer than that of N-channel transistors.

However, by replacing some of the P-channel transistors with N-channel transistors, a sufficient current driving ability can be obtained even in a smaller area, which leads to circuit integration. Note that the diode 155 may be formed using a N-channel transistor for the same reason.

Figure 5:
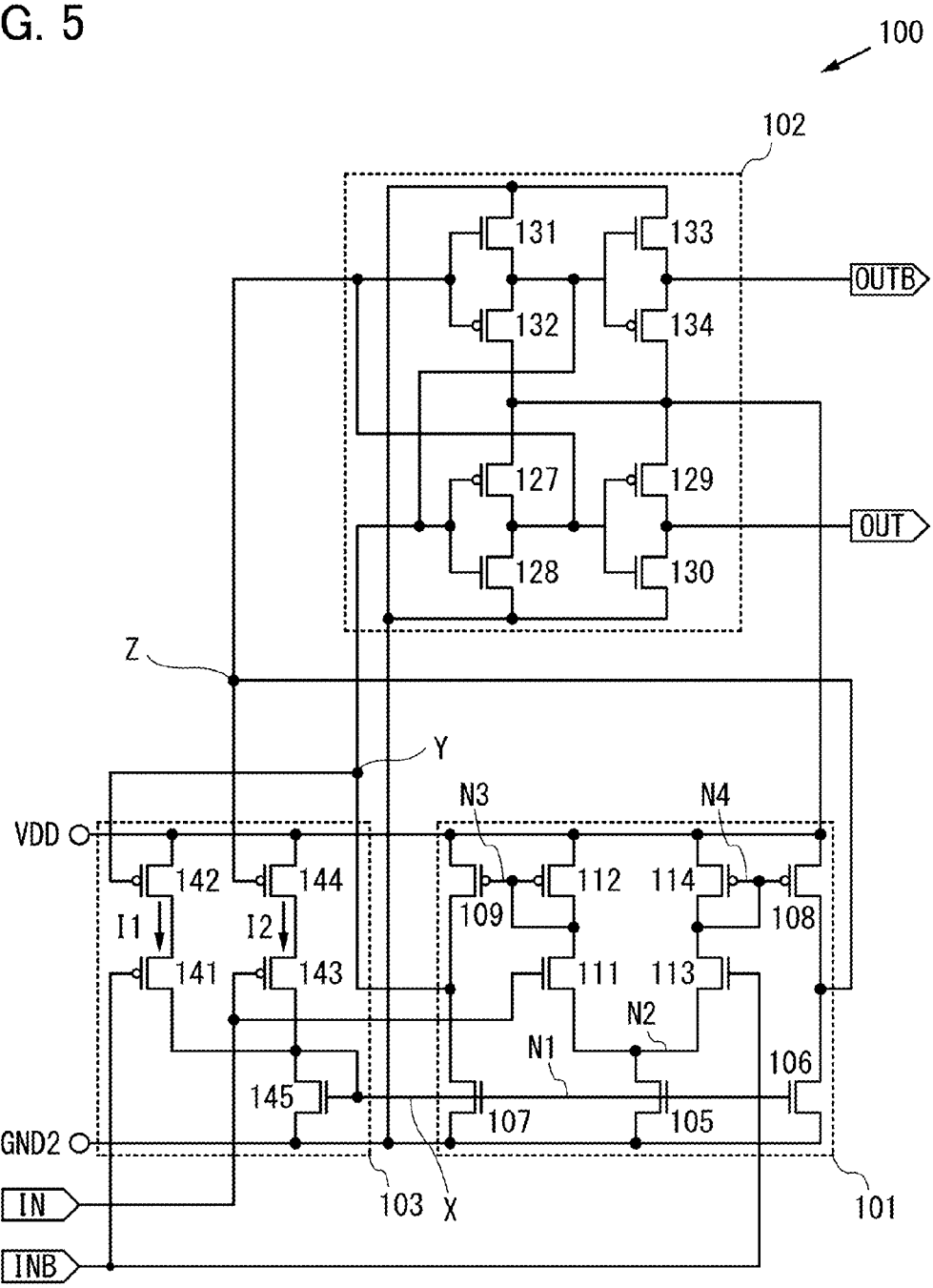
FIG. 5 illustrates a circuit example of a level shifter.

FIG. 5 illustrates the level shifter 100 including the amplifier circuit region 101, the latch circuit 102, and the current control circuit 103 which are described in FIGS. 2A and 2B, FIGS. 3A and 3B, and FIGS. 4A to 4C. For example, when GND2 is −2 V, GND1 is 0 V, and VDD is +1 V, the signal IN (and the inverted signal INB) with an amplitude of 1 V which is input from the low-voltage circuit can be output as the signal OUT (and the inverted signal OUTB) with an amplitude of 3 V.

Changes of the potentials of the terminals Y and Z with respect to the potential change of the signal IN (and the inverted signal INB) depends on the difference between the driving capability of the two inverters composed of the transistors 127, 128, 131, and 132 in the latch circuit 102 and that of the switches 106 and 107 and the transistors 108 and 109 in an amplification stage of the amplifier circuit region 101.

In other words, when the driving capability of the switches 106 and 107 and the transistors 108 and 109 in the amplifier circuit region 101 is higher than that of the transistors 127, 128, 131, and 132 in the latch circuit 102, the potentials of the terminals Y and Z can correspond to the signal IN and the inverted signal INB, respectively.

On the other hand, when the driving capability of the switches 106 and 107 and the transistors 108 and 109 in the amplifier circuit region 101 are lower than that of the transistors 127, 128, 131, and 132 in the latch circuit 102, the potentials of the terminals Y and Z cannot correspond to the signal IN and the inverted signal INB in some cases.

Thus, to lower the driving capability, it is preferable to design the channel widths of the transistors 127, 128, 131, and 132 in the latch circuit 102 to be shorter than those of the switches 106 and 107 and the transistors 108 and 109 in the amplifier circuit region 101.

Note that it is possible to increase the driving capability by designing the channel widths of the transistors 129, 130, 133, and 134 in the latch circuit 102 to be longer than those of the transistors 127, 128, 131, and 132.

Next, another circuit example of the differential amplifier circuit 104 is described. In the differential amplifier circuits 104 in FIGS. 2A to 2F, the signal IN and the inverted signal INB are input to a transistor closer to GND2 (e.g., the transistors 111 and 113); however, the signal IN and the inverted signal INB may be input to a transistor closer to VDD.

Figure 6A:
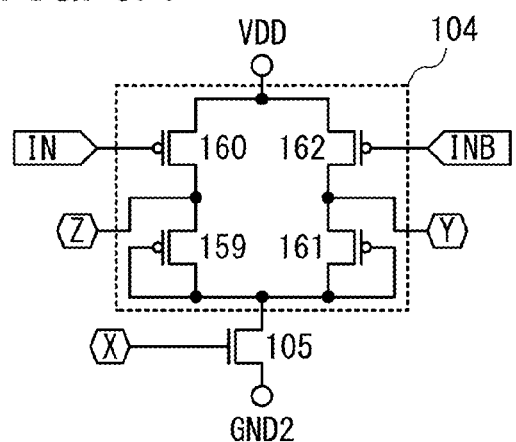
FIGS. 6A to 6D illustrate circuit examples of an amplifier circuit region.

The differential amplifier circuit 104 in FIG. 6A is composed of four P-channel transistors 159, 160, 161, and 162. The signal IN and the inverted signal INB are input to a gate of the transistor 160 and a gate of the transistor 162, respectively. Each of the transistors 159 and 161 is diode-connected. Further, a source of the transistor 159 and a drain of the transistor 160 are connected to the terminal Z. A source of the transistor 161 and a drain of the transistor 162 are connected to the terminal Y.

Figure 6B:
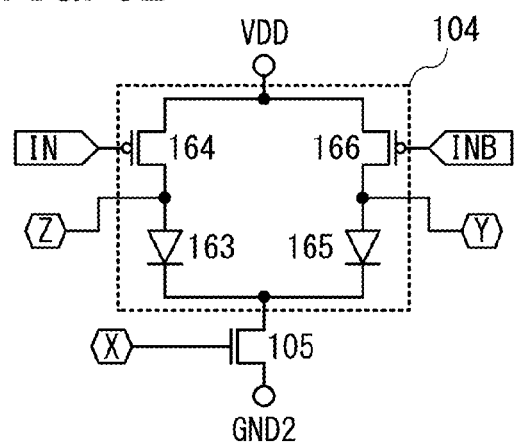

The differential amplifier circuit 104 in FIG. 6B is composed of diodes 163 and 165 and transistors 164 and 166 (both P-channel). The signal IN and the inverted signal INB are input to a gate of the transistor 164 and a gate of the transistor 166, respectively. Further, a drain of the transistor 164 and an anode of the diode 163 are connected to the terminal Z. A drain of the transistor 166 and an anode of the diode 165 are connected to the terminal Y. Note that the diodes 163 and 165 may be formed using N-channel transistors.

Figure 6C:
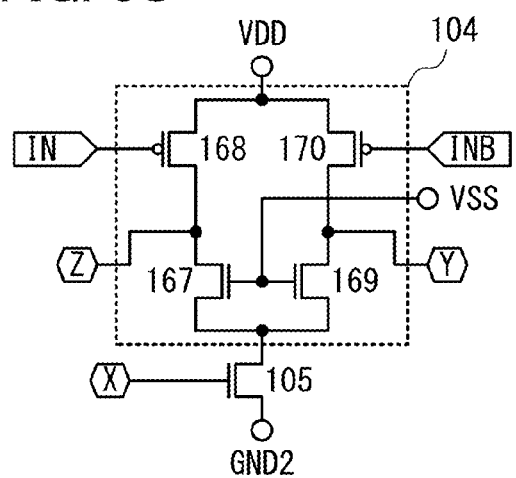

The differential amplifier circuit 104 shown in FIG. 6C includes transistors 167 and 169 (both N-channel) and transistors 168 and 170 (both P-channel). The signal IN and the inverted signal INB are input to a gate of the transistor 168 and a gate of the transistor 170, respectively. Each drain of the transistors 167 and 168 is connected to the terminal Z. Each drain of the transistors 169 and 170 is connected to the terminal Y.

In addition, each gate of the transistors 167 and 169 is held at the potential VSS. The transistors 167 and 169 may be P-channel transistors. The use of only transistors having the same conductivity achieves a simpler well structure than a combination of transistors having different conductivities, and thus leads to higher integration.

Figure 6D:
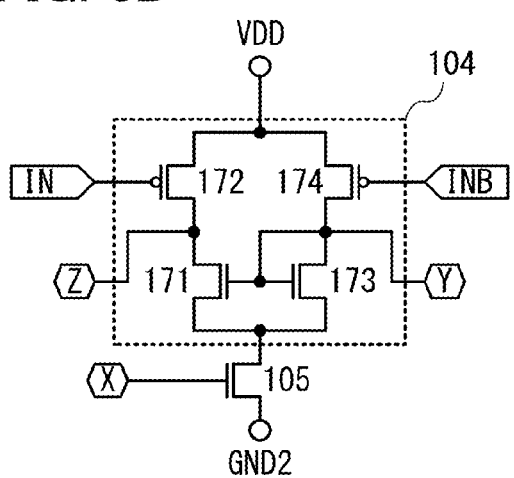

The differential amplifier circuit 104 shown in FIG. 6D includes transistors 171 and 173 (both N-channel) and transistors 172 and 174 (both P-channel). The signal IN and the inverted signal INB are input to a gate of the transistor 172 and a gate of the transistor 174, respectively. Each drain of the transistors 171 and 172 is connected to the terminal Z. Each drain of the transistors 173 and 174 is connected to the terminal Y. The terminal Y is connected to a gate of the transistor 171, whereas the terminal Z is not connected to a gate of the transistor 171. That is, the transistors 171 and 173 form a current mirror circuit.

The differential amplifier circuits 104 shown in FIGS. 6A to 6D can be used as the differential amplifier circuit 104 included in the amplifier circuit region 101 in FIG. 2B.

Figure 7:
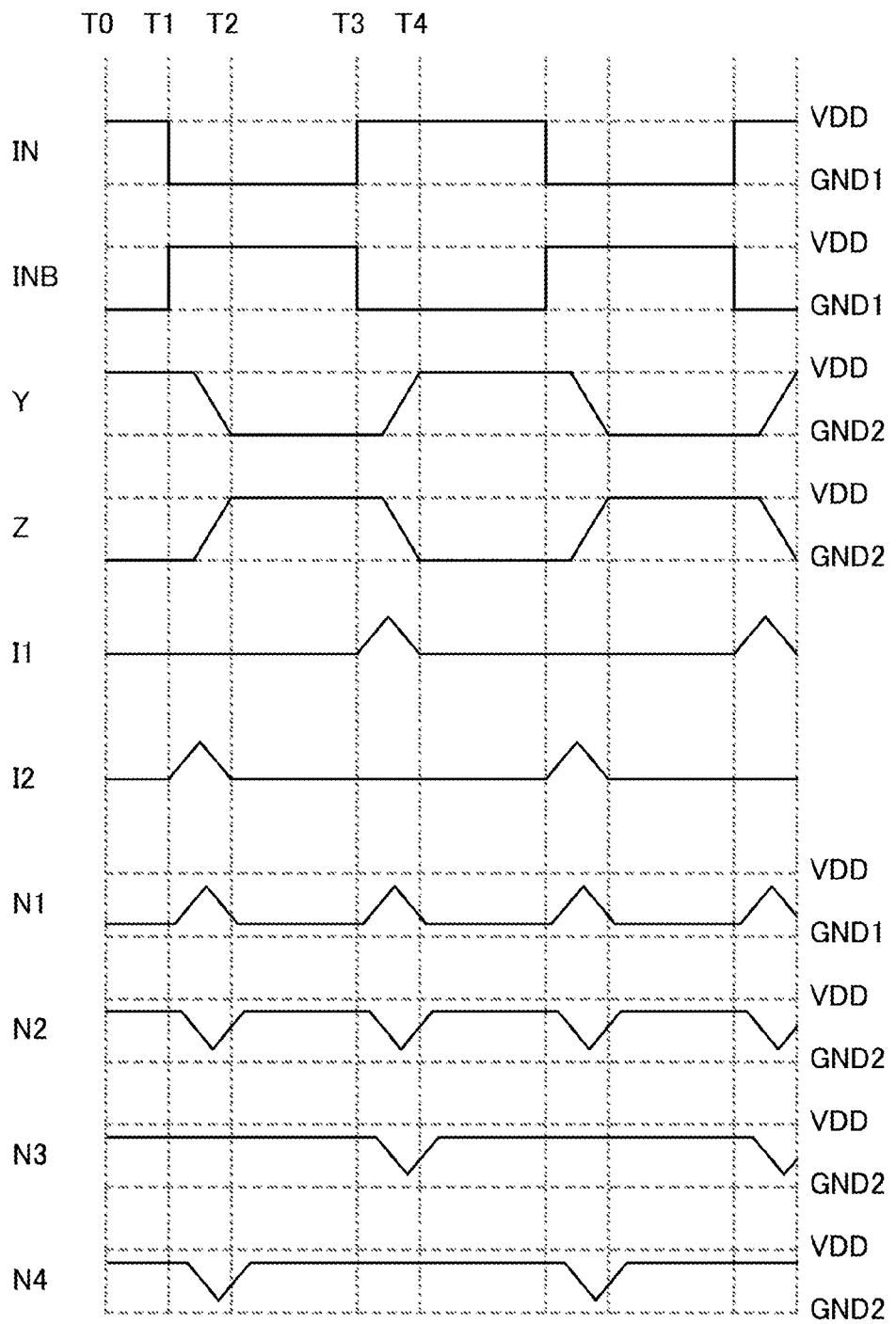
FIG. 7 illustrates s an operating example of a level shifter.

Next, an operating example of the level shifter 100 in FIG. 5 is described with reference to a timing chart in FIG. 7.

From time T0 to time T1 (i.e., in the holding period), the potential of the signal IN is VDD, the potential of the inverted signal INB is GND1, the potential of the terminal Y is at VDD, and the potential of the terminal Z is GND2. Thus, currents I1 and I2 do not flow. The potential of the node N1 is higher than GND2 by the threshold voltage of the transistor 145; thus, the switches 105 to 107 are substantially OFF.

Because the switch 105 is OFF, the potentials of the node N3 and the node N4 are lower than VDD by the threshold voltages of the transistors 112 and 114, respectively, and the transistors 108 and 109 are OFF. Because all of the switches 106 and 107 and the transistors 108 and 109 are OFF, the potentials of the terminals Y and Z do not change.

From time T1 to T2 (i.e., in the transition period), the potential of the signal IN changes from VDD to GND1, and the potential of the inverted single INB changes from GND1 to VDD. However, potential change of the terminals Y and Z is delayed; the potential of the terminal Y remains at VDD (or close to VDD) and the potential of the terminal Z remains at GND2 (or close to GND2) for a certain period.

Here, because the transistors 143 and 144 are ON at the same time, the current I2 flows through them and the potential of the node N1 is increased. Consequently, the switches 105 to 107 are ON and the potential of the node N2 is decreased. Further, the resistance of the transistor 111 becomes higher than that of the transistor 113, so that the potential of the node N3 becomes higher than that of the node N4. Thus, the potential of the terminal Y becomes lower than that of the terminal Z.

As a result, the potential of the terminal Y changes from VDD to GND2, and the potential of the terminal Z changes from GND2 to VDD. These potentials are immediately held (fixed) by the operation of the latch circuit 102.

From time T2 to time T3 (i.e., in the holding period), the potential of the signal N is GND1, the potential of the inverted signal INB is VDD, the potential of the terminal Y is at GND2, and the potential of the terminal Z is VDD. Thus, the currents I1 and I2 do not flow. The potential of the node N1 is higher than GND1 by the threshold voltage of the transistor 145; thus, the switches 105 to 107 are OFF.

Because the switch 105 is OFF, the potentials of the node N3 and the node N4 are lower than VDD by the threshold voltages of the transistors 112 and 114, respectively, and the transistors 108 and 109 are OFF. Because all of the switches 106 and 107 and the transistors 108 and 109 are OFF, the potentials of the terminals Y and Z do not change.

From time T3 to T4 (i.e., in the transition period), the potential of the signal IN changes from GND1 to VDD, and the potential of the inverted single INB changes from VDD to GND1. However, potential change of the terminals Y and Z is delayed; the potential of the terminal Y remains at GND2 (or close to GND2) and the potential of the terminal Z remains at VDD (or close to VDD) for a certain period.

Thus, the transistors 141 and 142 are ON at the same time, the current I1 flows through them, the potential of the node N1 is increased, and the switches 105 to 107 are ON. Further, the resistance of the transistor 111 becomes higher than that of the transistor 113, so that the potential of the node N3 becomes higher than that of the node N4.

As a result, the potential of the terminal Z changes from VDD to GND2, and the potential of the terminal Y changes from GND2 to VDD. These potentials are immediately held (fixed) by the operation of the latch circuit 102.

(Embodiment 2)

In this embodiment, some embodiments of a level shifter will be described.

Figure 8A:
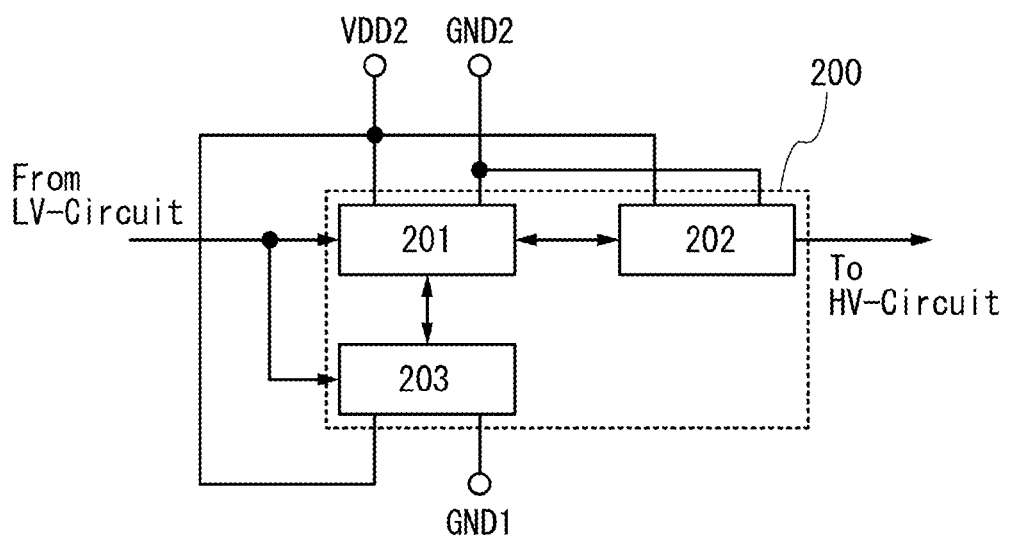
FIGS. 8A and 8B illustrate structure examples of a level shifter.

FIG. 8A is a block diagram of a level shifter 200. The level shifter 200 includes an amplifier circuit region 201, a latch circuit 202, and a current control circuit 203. In the amplifier circuit region 201, the latch circuit 202, and the current control circuit 203, a high potential is VDD2. In the amplifier circuit region 201 and the latch circuit 202, a low potential is GND2. In the current control circuit 203, a low potential is GND1.

A signal is input from a low-voltage circuit (LV-Circuit) to the amplifier circuit region 201 and the current control circuit 203, and the potential of this signal is higher than or equal to GND1 and lower than or equal to VDD1 (GND2<GND1<VDD1<VDD2). A difference between GND2 and GND1 may be larger than the threshold voltage of a transistor which is used. In addition, the relation of VDD2-VDD1>GND1-GND2 or GND1-GND2>VDD1-GND1 is possible, for example.

Figure 8B:
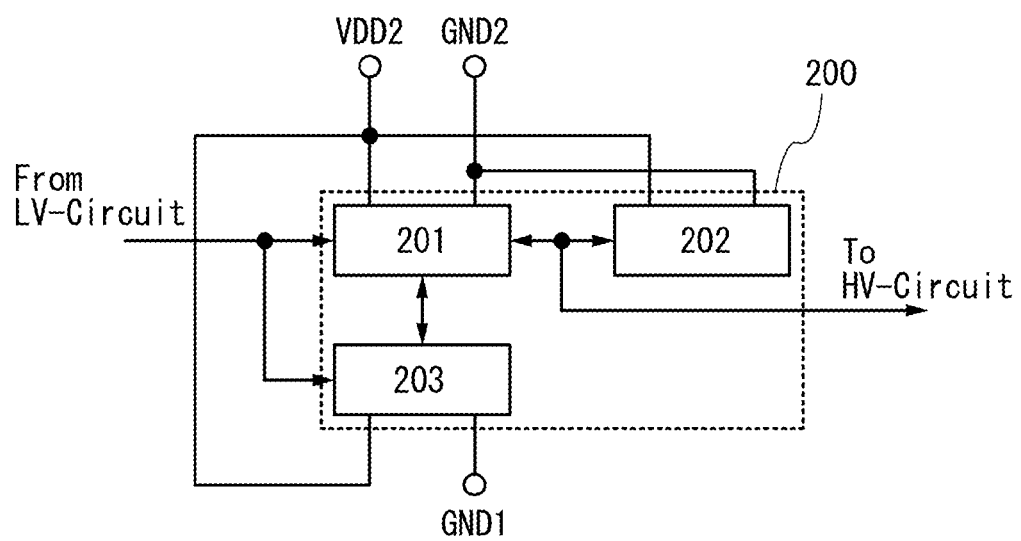

For example, not only does output of the amplifier circuit region 201 serves as input of the latch circuit 202 to be output to a high-voltage circuit (HV-Circuit) as shown in FIG. 8A, but it can be input to the latch circuit 202 and is also branched to the high-voltage circuit as shown in FIG. 8B. The level shifter 200 may have a structure other than those in FIGS. 2A and 2B.

Note that the potential VDD2 and/or the potential GND2 are/is not only output to the outside, bus also used in an internal circuit.

Figure 9A:
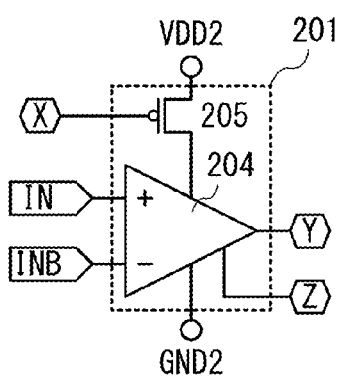
FIGS. 9A to 9F illustrate circuit examples of an amplifier circuit region.

FIG. 9A is a circuit example of the amplifier circuit region 201 that can be used in the level shifter 200. The amplifier circuit region 201 includes a differential amplifier circuit 204 and a switch 205 for controlling power supplied to the differential amplifier circuit 204. The differential amplifier circuit 204 is supplied with VDD2 and GND2.

The differential amplifier circuit 204 shown in FIG. 9A is provided with at least one of or both of terminals to which the signal IN and the inverted signal INB are input from the low-voltage circuit to the differential amplifier circuit 204, and terminals X, Y, and Z. The terminal X is used to control the switch 205. An output signal of the differential amplifier circuit 204 is output from the terminal Y. An inverted signal of an output signal is often output from the differential amplifier circuit, specifically from the terminal Z.

When the differential amplifier circuit 204 operates all the time, power consumption is increased; thus, the operation is controlled with the switch 205 so that the differential amplifier circuit 204 operates only when needed. Specifically, when the input signal IN is changed from H to L or from L to H, the potential of the terminal X is changed so that the switch 205 is turned on. Note that the potential of the terminal X is higher than or equal to GND1 and lower than or equal to VDD2. As the switch 205, a P-channel transistor can be used, for example.

Here, VDD2 is controlled among the power supply potentials of the differential amplifier circuit 204. Alternatively, GND2 can be controlled in a similar manner. In that case, an N-channel transistor is used and the potential of the gate is set to be higher than or equal to GND2 and lower than or equal to VDD1. Accordingly, the structure of the current control circuit 203 is different from one described later, and the structure described in Embodiment 1 can be employed.

Figure 9B:
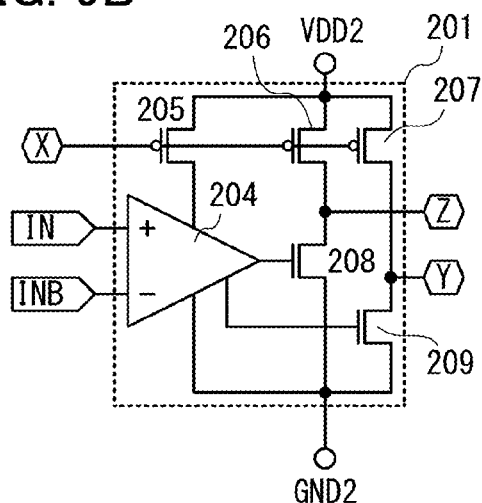

In the case where a sufficient gain cannot be obtained only by the differential amplifier circuit 204, one or both of amplifier transistors 208 and 209 shown in FIG. 9B may be provided so that each gate is connected to the output of the differential amplifier circuit 204. Also in this case, in order to reduce power consumption, a drain of the transistor 208 and a drain of the transistor 209 may be connected to a drain of a P-channel switch 206 and a drain of an P-channel switch 207, respectively, to control the supply of VDD2 by the switches 206 and 207.

Although in the example of FIG. 9B, N-channel transistors are used as the transistors 208 and 209, P-channel transistors may be used. In that case, as the switches 205 to 207, an N-channel transistor can be used, for example.

Figure 9C:
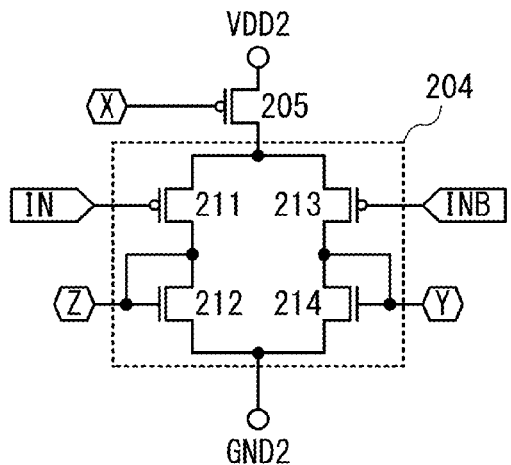

FIG. 9C is an example of the amplifier circuit region 201. The differential amplifier circuit 204 shown in FIG. 9C includes transistors 211 and 213 (both P-channel) and transistors 212 and 214 (both N-channel). The signal IN and the inverted signal INB of the signal IN are input to a gate of the transistor 211 and a gate of the transistor 213, respectively. The terminal Z is connected to each drain of the transistors 211 and 212. The terminal Y is connected to each drain of the transistors 213 and 214. The terminal Z and the terminal Y are also connected to the gate of the transistor 212 and the gate of the transistor 214, respectively. In other words, each of the transistors 212 and 214 is diode-connected and serve as a load of the differential amplifier circuit 204.

The differential amplifier circuit 204 has a function of amplifying the potential difference between the signal IN and the inverted signal INB. That is, when a potential difference between the signal IN and the inverted signal INB is VDD1-GND1, a potential difference between the terminals Y and Z can be VDD2-GND2 at the maximum.

When the potential of the terminal X is a potential at which the switch 205 is turned on, the potential of the signal IN is VDD1, for example, and accordingly the potential of the inverted signal INB is GND1, in which case the resistance of the transistor 213 is higher than that of the transistor 211. Consequently, the potential of the terminal Y is lower than that of the terminal Z.

Figure 9D:
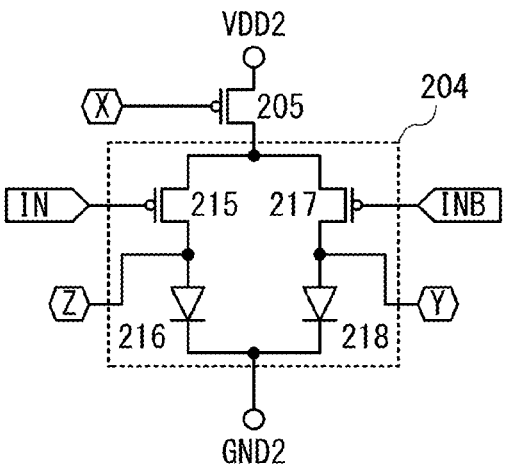

FIG. 9D is another example of the amplifier circuit region 201. The differential amplifier circuit 204 shown in FIG. 9D includes transistors 215 and 217 (both P-channel) and diodes 216 and 218. The signal IN and the inverted signal INB of the signal IN are input to a gate of the transistor 215 and a gate of the transistor 217, respectively. The terminal Z and the terminal Y are connected to a drain of the transistor 215 and a drain of the transistor 217, respectively. The diodes 216 and 218 serve as a load of the differential amplifier circuit 204.

The diode can be a P-channel transistor. The use of only transistors having the same conductivity achieves a simpler well structure than a combination of transistors having different conductivities, and thus leads to higher integration.

Figure 9E:
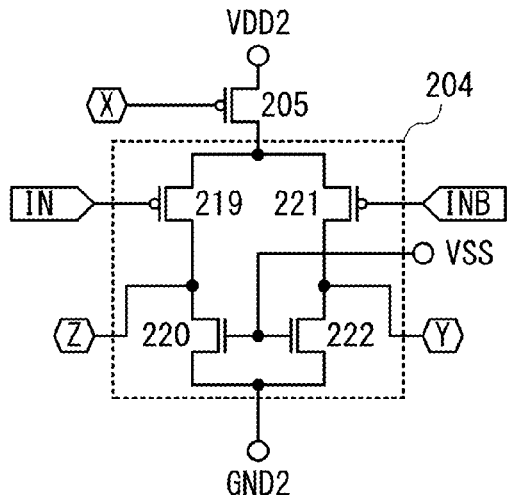

FIG. 9E is an example of the amplifier circuit region 201. The differential amplifier circuit 204 shown in FIG. 9E includes transistors 219 and 221 (both P-channel) and transistors 220 and 222 (both N-channel). The signal IN and the inverted signal INB of the signal IN are input to a gate of the transistor 219 and a gate of the transistor 221, respectively. The terminal Z is connected to each drain of the transistors 219 and 220. The terminal Y is connected to each drain of the transistors 221 and 222.

A potential VSS is applied to a gate of the transistor 220 and a gate of the transistor 222. The potential VSS is higher than GND2 and lower than VDD2. For example, GND1 can be used as the potential VSS. The transistors 220 and 222 can be P-channel transistors. In any cases, VSS is set so that the transistors 220 and 222 can have appropriate resistances.

The differential amplifier circuit 204 in FIG. 9E can be driven in a wide operating range than that of the differential amplifier circuit 204 in FIG. 9C or FIG. 9D. For example, because a constant potential is always applied to the gate of the transistor 220 and the gate of the transistor 222, the potential of the terminal Z can be decreased to GND2 when the transistor 219 is OFF and the potential of the terminal Y can be decreased to GND2 when the transistor 221 is OFF. Note that the resistances of the transistors 220 and 222 can be varied depending on the level of the potential VSS and thus the amount of current flowing them can be adjusted.

Figure 9F:
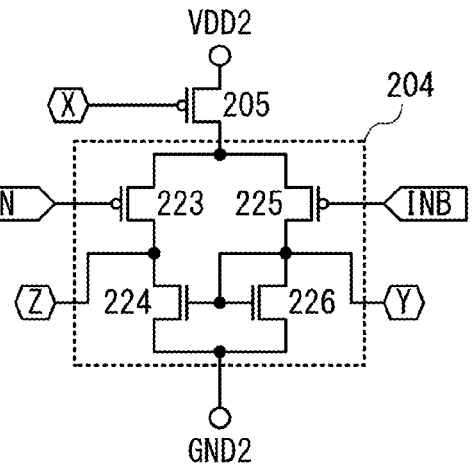

FIG. 9F is an example of the amplifier circuit region 201. The differential amplifier circuit 204 shown in FIG. 9F includes transistors 223 and 225 (both P-channel) and transistors 224 and 226 (both N-channel). The signal IN and the inverted signal INB of the signal IN are input to a gate of the transistor 223 and a gate of the transistor 225, respectively. The terminal Z is connected to each drain of the transistors 223 and 224. The terminal Y is connected to each drain of the transistors 225 and 226. The terminal Y is connected to a gate of the transistor 226, whereas the terminal Z is not connected to a gate of the transistor 224. That is, the transistors 224 and 226 form a current mirror circuit.

The differential amplifier circuits 204 shown in FIGS. 9C to 9F can be used as the differential amplifier circuit 204 included in the amplifier circuit region 201 in FIG. 9B. Note that the potentials of the terminals Y and Z of the differential amplifier circuit 204 sometimes do not rise to VDD2 or fall to GND2. In that case, the terminals Y and Z are connected to a latch circuit to maintain their potentials at VDD2 or GND2. Note that by providing a latch circuit, an output signal can be output also in a holding period during which the differential amplifier circuit 204 does not operate (this period will be described later).

Figure 10A:
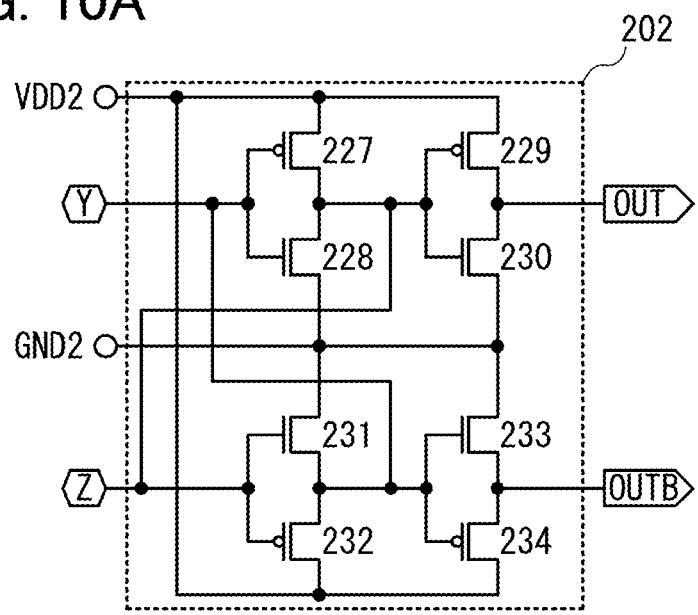
FIGS. 10A to 10B illustrate circuit examples of a latch circuit.
Figure 10B:
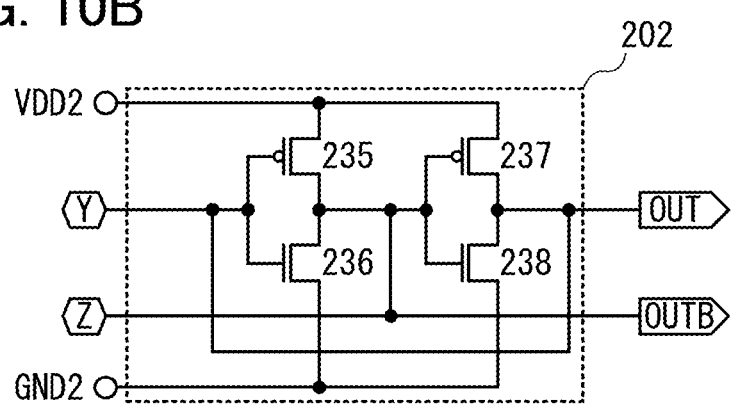

FIGS. 10A and 10B are example of the latch circuit 202.

The latch circuit 202 in FIG. 10A is composed of four inverters including transistors 227 to 234. The terminals Y and Z, which are mentioned in the description of the amplifier circuit region 201, serve as input terminals of the first-stage two inverters. In the latch circuit 202 in FIG. 10A, the output of one of the first-stage inverters is input to the other first-stage inverter and the second-stage inverter, so that a signal OUT and an inverted signal OUTB of the signal OUT are output from the second-stage inverters.

The latch circuit 202 in FIG. 10B is composed of two inverters including transistors 235 to 238. The terminals Y and Z, which are mentioned in the description of the amplifier circuit region 201, are connected to an input terminal of a first-stage inverter and an input terminal of a second-stage inverter, respectively. The output of the second-stage inverter is input to the first-stage inverter. In addition, the signal OUT and the inverted signal OUTB are output from the terminal Y and the terminal Z, respectively.

Figure 11A:
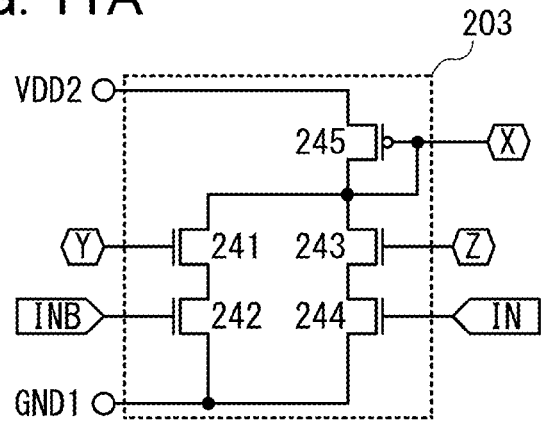
FIGS. 11A to 11C illustrate circuit examples of a current control circuit.

FIG. 11A is an example of the current control circuit 203. The current control circuit 203 in FIG. 11A includes transistors 241 to 244 (all N-channel) and a transistor 245 (P-channel). The transistors 241 and 242 are connected in series. The transistors 243 and 244 are connected in series. The potentials of sources of the transistors 242 and 244 are held at GND1. Drains of the transistors 241 and 243 are connected to a drain and a gate of the transistor 245. The drain and the gate of the transistor 245 are connected to the terminal X. The potential of a source of the transistor 245 is held at an appropriate potential, for example, VDD2. The transistor 245 functions as a diode.

Note that the potential applied to the source of the transistor 245 is not limited to VDD2 and can be a potential at which the transistor 245 can operate in a saturation region.

A gate of the transistor 244 and a gate of the transistor 242 are respectively supplied with the signal IN and the inverted signal INB which are input from the low-voltage circuit. A gate of the transistor 241 and a gate of the transistor 243 are connected to the terminal Y and the terminal Z, respectively. Note that the terminals X, Y, and Z are the same as those mentioned in the description of the amplifier circuit region 201.

Note that the structure is not limited to this. It is possible to employ a structure in which the gates of the transistors 243 and 241 are respectively supplied with the signal IN and the inverted signal INB input from the low-voltage circuit, and the gates of the transistors 242 and 244 are connected to the terminals Y and Z, respectively.

While the signal IN is not changed (hereinafter, this period is referred to as holding period) in a row of the transistors 241 and 242 or a row of the transistors 243 and 244, if the signal IN is VDD1, the inverted signal is GND1, the potential of the terminal Y is VDD2, and the potential of the terminal Z is GND2. If the signal IN is GND1, the inverted signal INB is VDD1, the potential of the terminal Y is GND2, and the potential of the terminal Z is VDD2. That is, GND1 or GND2 is applied to either one of the gates of the two transistors in each row, so that current does not flow in the two rows. Accordingly, the potential of the terminal X is raised from VDD2 by the threshold voltage of the transistor 245.

The potential of the terminal Y (or the terminal Z) corresponds to the potential of the signal IN and is output via the differential amplifier circuit 204 and the like. Thus, the potential of the terminal Y changes with respect to the signal IN after a certain period (hereinafter, this period is referred to as a transition period).

For example, the case where the potential of the signal IN changes from VDD1 to GND1 is described. Here, the potential of the terminal Y changes from VDD2 to GND2. Further, the potential of the inverted signal INB changes from GND1 to VDD1 in the above-described transition period; thus, a period during which the potential of the terminal Y remains at VDD2 (or a potential close to VDD2) occurs after the inverted signal INB changes to VDD1. That is, a period during which the transistors 241 and 242 are ON at the same time occurs. As a result, the potential of the terminal X is decreased.

Furthermore, the case where the potential of the signal IN changes from GND1 to VDD1 is described. Here, the potential of the terminal Z changes from VDD2 to GND2. The potential of the signal IN changes from GND1 to VDD1 in the transition period; thus, a period during which the potential of the terminal Z remains at VDD2 (or a potential close to VDD2) occurs after the signal IN changes to VDD1. That is, a period during which the transistors 243 and 244 are ON at the same time occurs. As a result, the potential of the terminal X is decreased.

After the transition period, the holding period starts. The transistor 245 has a function of increasing the potential of the terminal X again in the holding period, after the potential of the terminal X decreases in the transition period.

In this manner, the potential of the terminal X decreases only when the potential of the signal IN changes (during a certain period after the change), and after a while, the potential of the terminal X increases and returns to the original state (before the potential change). In the amplifier circuit region 201, the switch 205 is turned on only when the potential of the terminal X decreases, so that the differential amplifier circuit 204 operates. In the other periods, the differential amplifier circuit 204 does not operate; thus, current consumption can be suppressed.

Note that the current control circuit 203 is not limited to the circuit in FIG. 11A. Any circuit can be used as long as the potential of one of the terminals (e.g., the terminal X) can be changed when the signal IN (and the inverted signal INB) is changed. Further, the potential change at that time may be either decrease or increase.

The current control circuit 203 in FIG. 11A utilizes delay of the potentials of the terminals Y and Z compared to the signal IN and the inverted signal INB. The similar effect can be obtained by inputting, for example, a delay signal that is obtained by inputting the signal IN to a delay circuit (e.g., a circuit in which a plurality of inverters are connected in series), instead of the potentials of the terminals Y and Z.

Figure 11B:
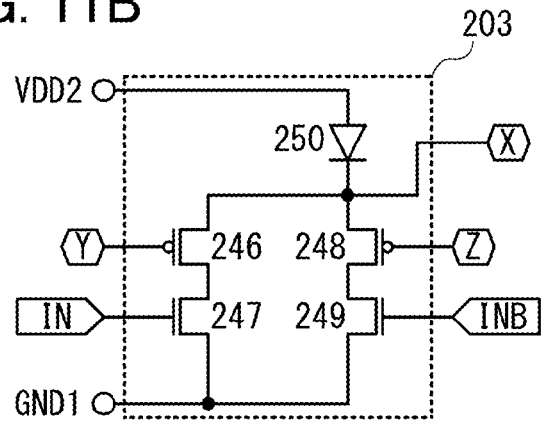

Although, the transistors 241 and 243 are N-channel transistors in FIG. 11A, they may be P-channel transistors as in FIG. 11B.

The current control circuit 203 in FIG. 11B includes transistors 246 and 248 (both P-channel), transistors 247 and 249 (both N-channel), and a diode 250. The transistors 246 and 247 are connected in series. The transistors 248 and 249 are connected in series. The potentials of sources of the transistors 247 and 249 are held at GND1. Drains of the transistors 246 and 248 are connected to an anode of the diode 250 which is connected to the terminal X. The potential of a cathode of the diode 250 is held at VDD2.

Instead of the diode 250, a transistor may be used as in the current control circuit 203 in FIG. 11A. The diode 250 may be formed using a N-channel transistor.

A gate of the transistor 247 and a gate of the transistor 249 are respectively supplied with the signal IN and the inverted signal INB which are input from the low-voltage circuit. A gate of the transistor 246 and a gate of the transistor 248 are connected to the terminal Y and the terminal Z, respectively.

Figure 11C:
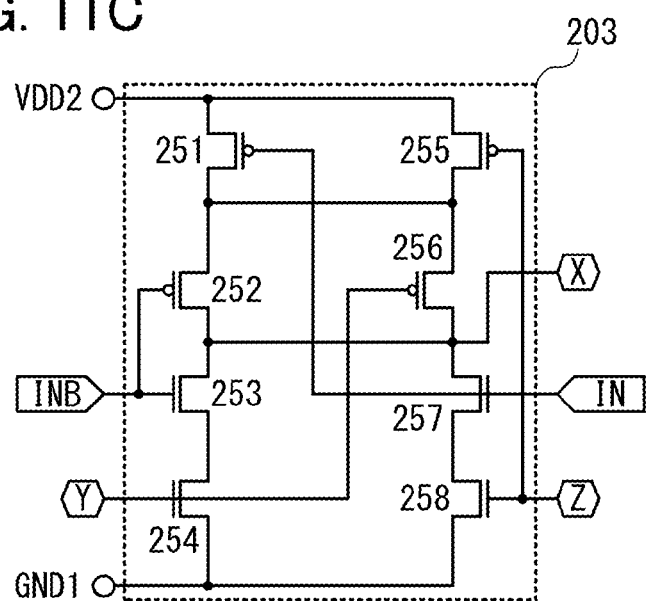

The current control circuit 203 in FIG. 11C includes transistors 251, 252, 255, and 256 (all P-channel) and transistors 253, 254, 257, and 258 (all N-channel).

The transistors 251 to 254 are connected in series. The transistors 255 to 258 are connected in series. A source of the transistor 254 and a source of the transistor 258 are held at GND1. A source of the transistor 251 and a source of the transistor 255 are held at VDD2. A source of the transistor 252 is connected to a source of the transistor 256. A drain of the transistor 252 and a drain of the transistor 256 are connected to the terminal X.

The signal IN is input to each gate of the transistors 251 and 257. The inverted signal INB is input to each gate of the transistors 252 and 253. Each gate of the transistors 254 and 256 is connected to the terminal Y. Each gate of the transistors 255 and 258 is connected to the terminal Z.

Note that the following structure is possible: the signal IN is input to the gates of the transistors 255 and 258, the inverted signal INB is input to the gates of the transistors 254 and 256, the terminal Y is connected to the gates of the transistors 252 and 253, and the terminal Z is connected to the gates of the transistors 251 and 257.

In the current control circuit 203 in FIG. 11C, like the current control circuit 203 in FIG. 11A, the potential of the terminal X remains VDD2 or is close to VDD2 when the signal IN does not change. However, when the signal IN changes, current flows in either the row of the transistors 251 to 254 or the row of the transistors 255 to 258, so that the potential of the terminal X is decreased.

In a way, the current control circuit 203 can be regarded as a circuit in which each output of two AND gates having two inputs is input to an OR gate and the output of the OR gate is inverted. This logic circuit is known as an AND-OR-INVERT gate (AOI gate). Here, the potential of the signal IN and the potential of the terminal Z are input to one AND gate, and the potential of the inverted signal INB and the potential of the terminal Y are input to the other AND gate. The terminal X is connected to the output terminal of the OR gate.

In another way, the control current circuit 203 can be regarded as an XNOR gate having two inputs. Here, the potential of the signal IN and the potential of the terminal Y are input to the XNOR gate. The potential of the inverted signal INB and the potential of the terminal Z may be input to the XNOR gate.

Note that in the case where the potential of the terminal X is increased in accordance with the change of the signal IN, the current control circuit 203 can be regarded as either an AND-OR gate or an XOR gate.

Unlike in an ordinary logic circuit, attention needs to be paid that potentials of input signals are different or a potential of an input signal and a potential of power supply are different.

Figure 12:
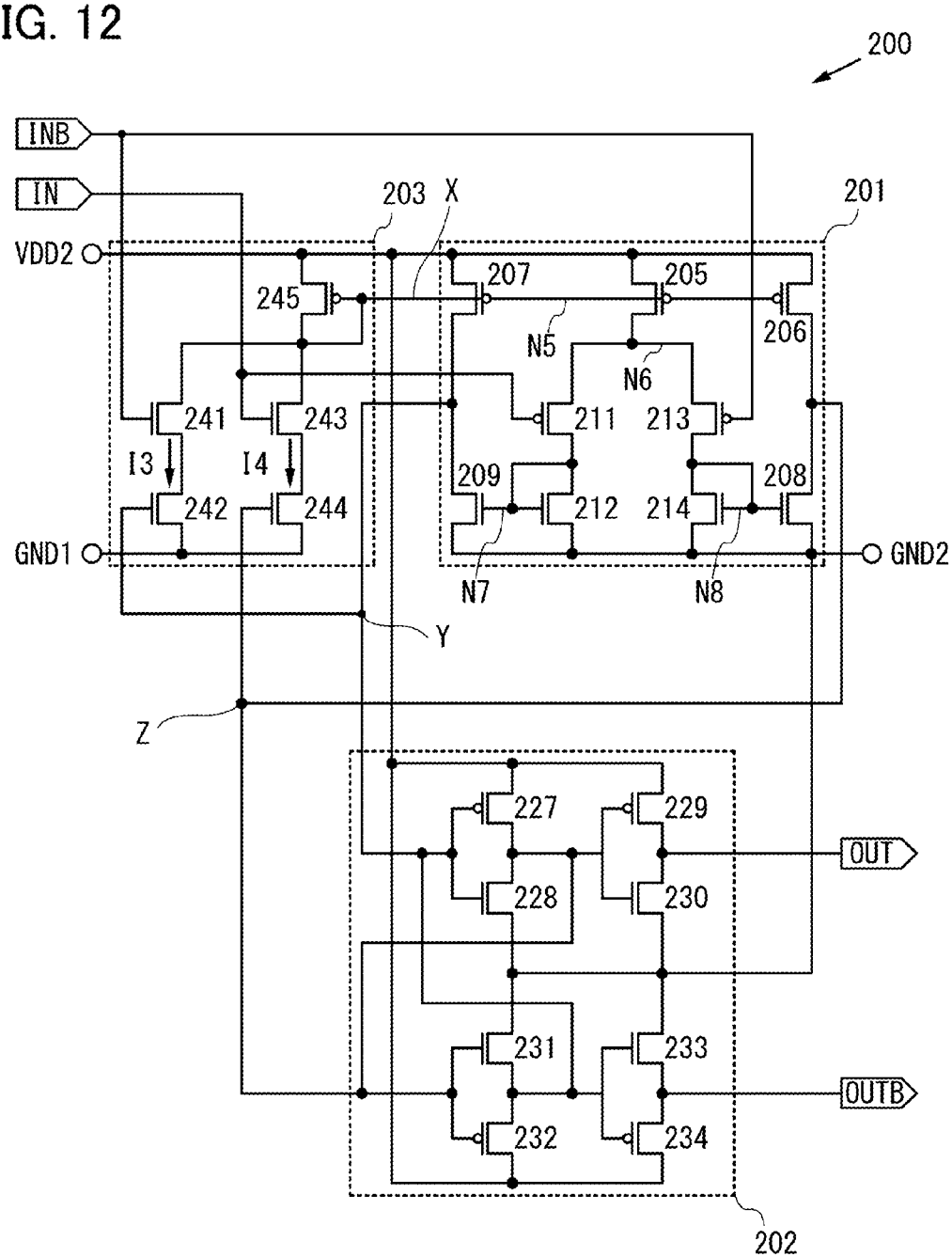
FIG. 12 illustrates a circuit example of a level shifter.

FIG. 12 illustrates the level shifter 200 including the amplifier circuit region 201, the latch circuit 202, and the current control circuit 203 which are described in FIGS. 9A to 9F, FIGS. 10A and 10B, and FIGS. 11A and 11B. For example, when GND2 is −0.5 V, GND1 is 0 V, VDD1 is +0.2 V, and VDD2 is +2.5 V, the signal IN (and the inverted signal INB) with an amplitude of 0.2 V which is input from the low-voltage circuit can be output as the signal OUT (and the inverted signal OUTB) with an amplitude of 3 V.

Changes of the potentials of the terminals Y and Z with respect to the potential change of the signal IN (and the inverted signal INB) depends on the difference between the driving capability of the two inverters composed of the transistors 227, 228, 231, and 232 in the latch circuit 202 and that of the switches 206 and 207 and the transistors 208 and 209 in an amplification stage of the amplifier circuit region 201.

In other words, when the driving capability of the switches 206 and 207 and the transistors 208 and 209 in the amplifier circuit region 201 is higher than that of the transistors 227, 228, 231, and 232 in the latch circuit 202, the potentials of the terminals Y and Z can correspond to the signal IN and the inverted signal INB, respectively.

On the other hand, when the driving capability of the switches 206 and 207 and the transistors 208 and 209 in the amplifier circuit region 201 are lower than that of the transistors 227, 228, 231, and 232 in the latch circuit 202, the potentials of the terminals Y and Z cannot correspond to the signal IN and the inverted signal INB in some cases.

Thus, to lower the driving capability, it is preferable to design the channel widths of the transistors 227, 228, 231, and 232 in the latch circuit 202 to be shorter than those of the switches 206 and 207 and the transistors 208 and 209 in the amplifier circuit region 201.

Note that it is possible to increase the driving capability by designing the channel widths of the transistors 229, 230, 233, and 234 in the latch circuit 202 to be longer than those of the transistors 227, 228, 231, and 232.

Next, another circuit example of the differential amplifier circuit 204 is described. In the differential amplifier circuits 204 in FIGS. 9A to 9F, the signal IN and the inverted signal INB are input to a transistor closer to VDD2 (e.g., the transistors 211 and 213); however, the signal IN and the inverted signal INB may be input to a transistor closer to GND2.

Figure 13A:
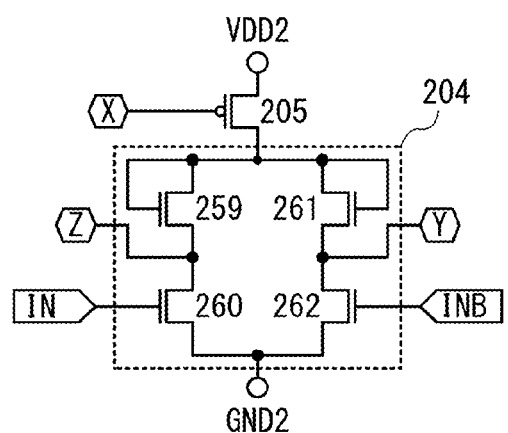
FIGS. 13A to 13D illustrate circuit example of an amplifier circuit region.

The differential amplifier circuit 204 in FIG. 13A is composed of four N-channel transistors 259, 260, 261, and 262. A structure using N-channel silicon transistors is advantageous in integration. The signal IN and the inverted signal INB are input to a gate of the transistor 260 and a gate of the transistor 262, respectively. Each of the transistors 259 and 261 is diode-connected. Further, a source of the transistor 259 and a drain of the transistor 261 are connected to the terminal Z. A source of the transistor 261 and a drain of the transistor 262 are connected to the terminal Y.

In the differential amplifier circuit 204 in FIG. 13A, when the amplitude of the signal IN and the inverted signal INB are smaller than the threshold voltages of the transistors 260 and 262 to which these signals are input, if GND2 is equal to a low potential of the signal IN and the inverted signal INB (i.e., GND2=GND1), the transistors 260 and 262 are both OFF even if the signal IN or the inverted signal INB is a high potential (VDD1), in which case normal operation cannot be performed.

On the other hand, when GND2 is lower than the low potentials of the signal IN and the inverted signal INB, the current driving capability of the transistors 260 and 262 can be improved.

Figure 13B:
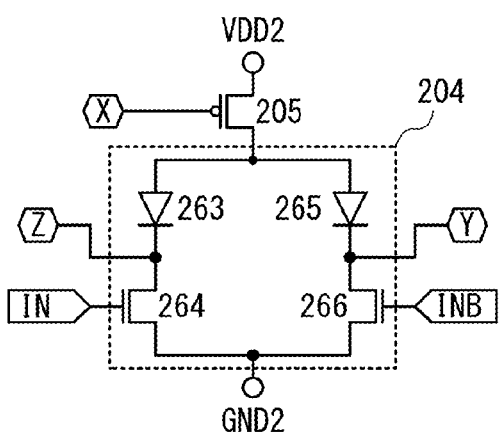

The differential amplifier circuit 204 in FIG. 13B is composed of transistors 264 and 266 (both N-channel) and diodes 263 and 265. The signal IN and the inverted signal INB are input to a gate of the transistor 264 and a gate of the transistor 266, respectively. Further, a drain of the transistor 264 and an anode of the diode 263 are connected to the terminal Z. A drain of the transistor 266 and an anode of the diode 265 are connected to the terminal Y. Note that the diodes 263 and 265 may be formed using P-channel transistors.

Figure 13C:
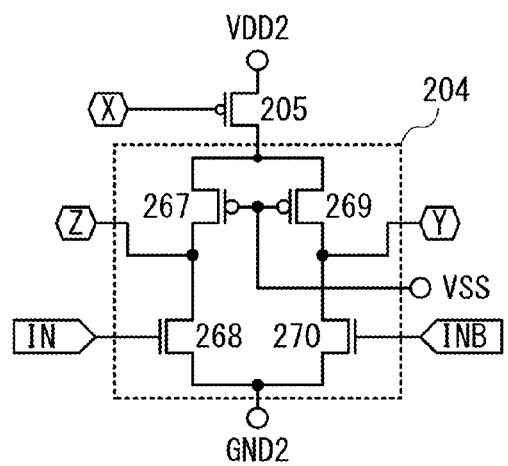

The differential amplifier circuit 104 shown in FIG. 13C includes transistors 267 and 269 (both P-channel) and transistors 268 and 270 (both N-channel). The signal IN and the inverted signal INB are input to a gate of the transistor 268 and a gate of the transistor 270, respectively. Each drain of the transistors 267 and 268 is connected to the terminal Z. Each drain of the transistors 269 and 270 is connected to the terminal Y.

In addition, each gate of the transistors 267 and 269 is held at the potential VSS. The transistors 267 and 269 may be N-channel transistors. The use of only transistors having the same conductivity achieves a simpler well structure than a combination of transistors having different conductivities, and thus leads to higher integration.

Figure 13D:
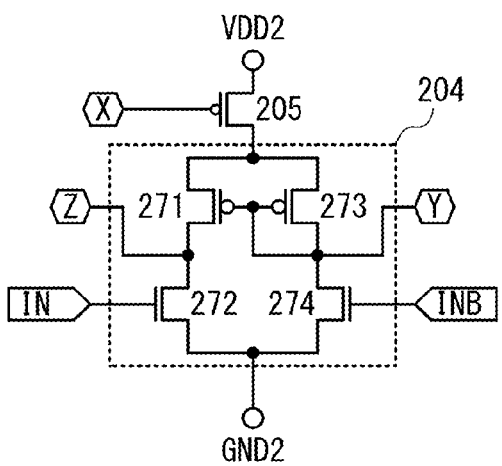

The differential amplifier circuit 204 shown in FIG. 13D includes transistors 271 and 273 (both P-channel) and transistors 272 and 274 (both N-channel). The signal IN and the inverted signal INB are input to a gate of the transistor 272 and a gate of the transistor 274, respectively. Each drain of the transistors 271 and 272 is connected to the terminal Z. Each drain of the transistors 273 and 274 is connected to the terminal Y. The terminal Y is connected to a gate of the transistor 271, whereas the terminal Z is not connected to a gate of the transistor 271. That is, the transistors 271 and 273 form a current mirror circuit.

The differential amplifier circuits 204 shown in FIGS. 13A to 13D can be used as the differential amplifier circuit 204 included in the amplifier circuit region 201 in FIG. 9B.

Figure 14:
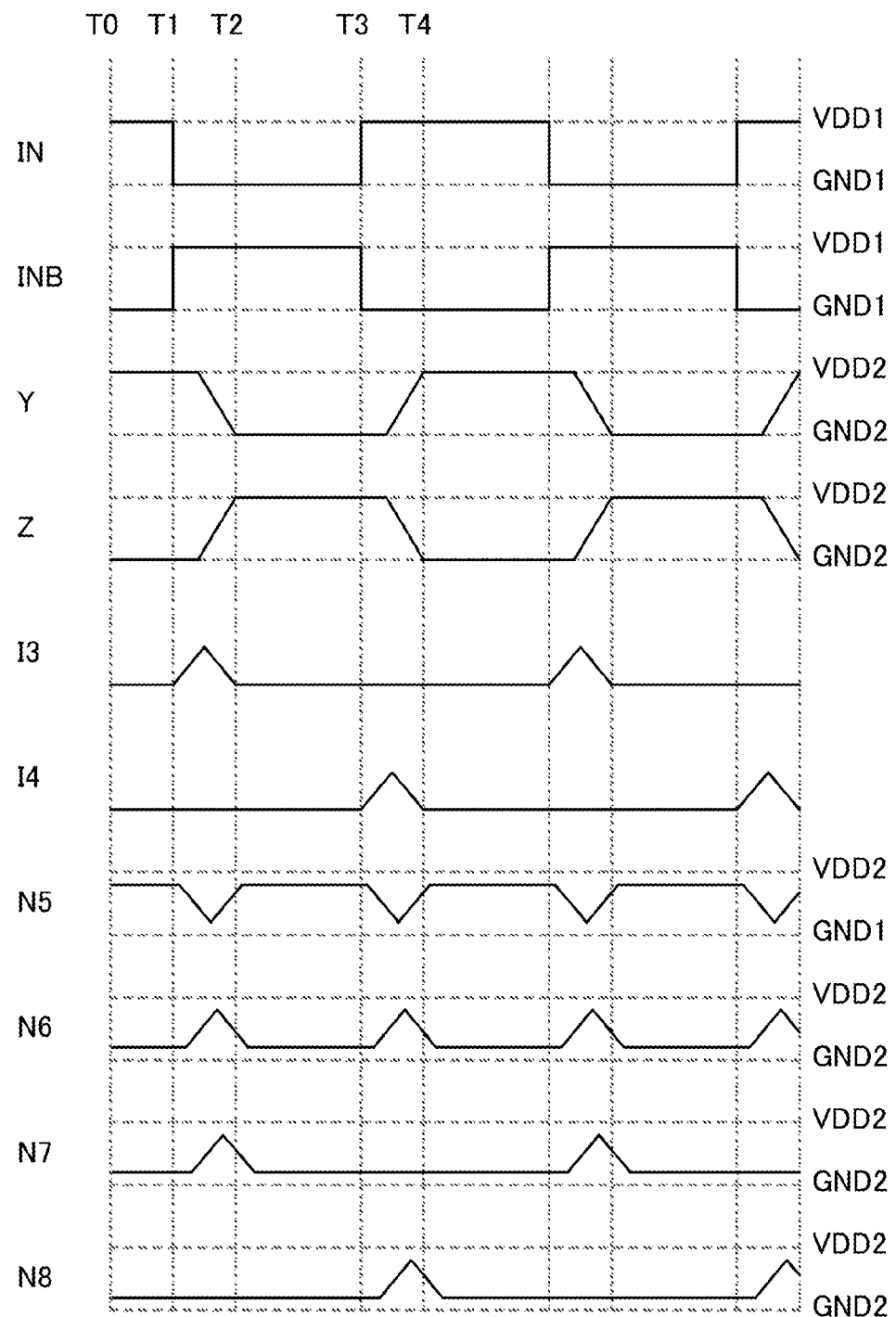
FIG. 14 illustrates an operating example of a level shifter.

Next, an operating example of the level shifter 200 in FIG. 12 is described with reference to a timing chart in FIG. 14.

From time T0 to time T1 (i.e., in the holding period), the potential of the signal N is VDD1, the potential of the inverted signal INB is GND1, the potential of the terminal Y is at VDD2, and the potential of the terminal Z is GND2. Thus, currents I3 and I4 do not flow. The potential of a node N5 is lower than VDD2 by the threshold voltage of the transistor 245; thus, the switches 205 to 207 are OFF.

Because the switch 205 is OFF, the potentials of a node N7 and a node N8 are higher than GND2 by the threshold voltages of the transistors 212 and 214, respectively, and the transistors 208 and 209 are OFF. Because all of the switches 206 and 207 and the transistors 208 and 209 are OFF, the potentials of the terminals Y and Z do not change.

From time T1 to T2 (i.e., in the transition period), the potential of the signal IN changes from VDD1 to GND1, and the potential of the inverted single INB changes from GND1 to VDD1. However, potential change of the terminals Y and Z is delayed; the potential of the terminal Y remains at VDD2 (or close to VDD2) and the potential of the terminal Z remains at GND2 (or close to GND2) for a certain period.

Here, because the transistors 241 and 242 are ON at the same time, the current I3 flows through them and the potential of the node N5 is decreased. Consequently, the switches 205 to 207 are ON and the potential of the node N6 is increased. Further, the resistance of the transistor 211 becomes lower than that of the transistor 213, so that the potential of the node N7 becomes lower than that of the node N8 . Thus, the potential of the terminal Y becomes lower than that of the terminal Z.

As a result, the potential of the terminal Y changes from VDD2 to GND2, and the potential of the terminal Z changes from GND2 to VDD2. These potentials are immediately held (fixed) by the operation of the latch circuit 202.

From time T2 to time T3 (i.e., in the holding period), the potential of the signal N is GND1, the potential of the inverted signal INB is VDD1, the potential of the terminal Y is at GND2, and the potential of the terminal Z is VDD2. Thus, the currents I3 and I4 do not flow. The potential of the node N5 is higher than GND1 by the threshold voltage of the transistor 245; thus, the switches 205 to 207 are OFF.

Because the switch 205 is OFF, the potentials of the node N7 and the node N8 are lower than GND2 by the threshold voltages of the transistors 212 and 214, respectively, and the transistors 208 and 209 are OFF. Because all of the switches 206 and 207 and the transistors 208 and 209 are OFF, the potentials of the terminals Y and Z do not change.

From time T3 to T4 (i.e., in the transition period), the potential of the signal IN changes from GND1 to VDD1, and the potential of the inverted single INB changes from VDD1 to GND1. However, potential change of the terminals Y and Z is delayed; the potential of the terminal Y remains at GND2 (or close to GND2) and the potential of the terminal Z remains at VDD2 (or close to VDD2) for a certain period.

Thus, the transistors 243 and 244 are ON at the same time, the current I4 flows through them, the potential of the node N5 is decreased, and the switches 205 to 207 are ON. Further, the resistance of the transistor 213 becomes lower than that of the transistor 211, so that the potential of the node N7 becomes lower than that of the node N8.

As a result, the potential of the terminal Z changes from VDD2 to GND2, and the potential of the terminal Y changes from GND2 to VDD2. These potentials are immediately held (fixed) by the operation of the latch circuit 202.

Here, the case where the amplitude of the signal IN is small is considered; for example, the amplitude is smaller than the threshold voltages of the transistors 212 and 214. Although the potentials of the sources of the transistors 212 and 214 are GND2 in the level shifter 200 in FIG. 12, the case where GND2 is equal to GND1 (i.e., GND2=GND1) is assumed.

In that case, the transistors 211 and 213 operate in a linear region. Thus, as the potential difference of VDD1-GND1 is small, the difference in resistance between the transistors 211 and 213 and the difference in potential between the nodes N7 and N8 become small. As a result, the differential amplifier circuit composed of the transistors 211 to 214 cannot operate normally, which increases instability.

When the potentials of the sources of the transistors 212 and 214 are GND2 (<GND1), both potentials of the nodes N7 and N8 are decreased. As a result, a drain-source voltage of the transistor 211 becomes larger than a gate-source voltage of the transistor 211, and a drain-source voltage of the transistor 213 becomes larger than a gate-source voltage of the transistor 213; thus, these transistors operate in a saturation region.

In the transistors 211 to 214 in FIG. 12, when the potential of the signal IN is higher than the potential of the inverted signal INB, the amount of current flowing through the transistors 211 and 212 is smaller than that of current flowing through the transistors 213 and 214. Thus, the difference in the amount of current becomes the difference in voltage between the drain-source voltage of the diode-connected transistor 212 and the drain-source voltage of the diode-connected transistor 214 (i.e., the potential difference between the nodes N7 and N8). Accordingly, the difference becomes sufficiently large when the potential difference VDD1-GND2 is close to or larger than the threshold voltage.

Therefore, the potential of the node N7 is sufficiently lower than the potential of the node N8 even if the potential of the signal IN is somewhat higher than the potential of the inverted signal INB. In other words, by setting GND2 to be lower than GND1 (i.e., GND2<GND1), boosting can be performed with high reliability even if the amplitude of the signal IN (VDD1-GND1) is small. The above description can be employed to the level shifter in Embodiment 1.

(Embodiment 3)

In this embodiment, an example in which a level shifter is used for a semiconductor device including a transistor with high off-state resistance is described.

It has recently been found that a transistor formed using an oxide semiconductor with a wide band gap has significantly high off-state resistance, and it has been proposed that the transistor is used to form a memory element or a signal processing circuit (see Patent Documents 2 to 4). In addition, with a highly thin polycrystalline silicon film, a transistor whose off-state resistance is three or more orders of magnitude higher than that of a conventional transistor has been formed, and its application to a gain cell has been suggested (see Patent Document 5).

In these circuits, a transistor with high off-state resistance is connected to a capacitor, and electric charge in and out of the capacitor is controlled by switching the transistor.

Figure 15A:
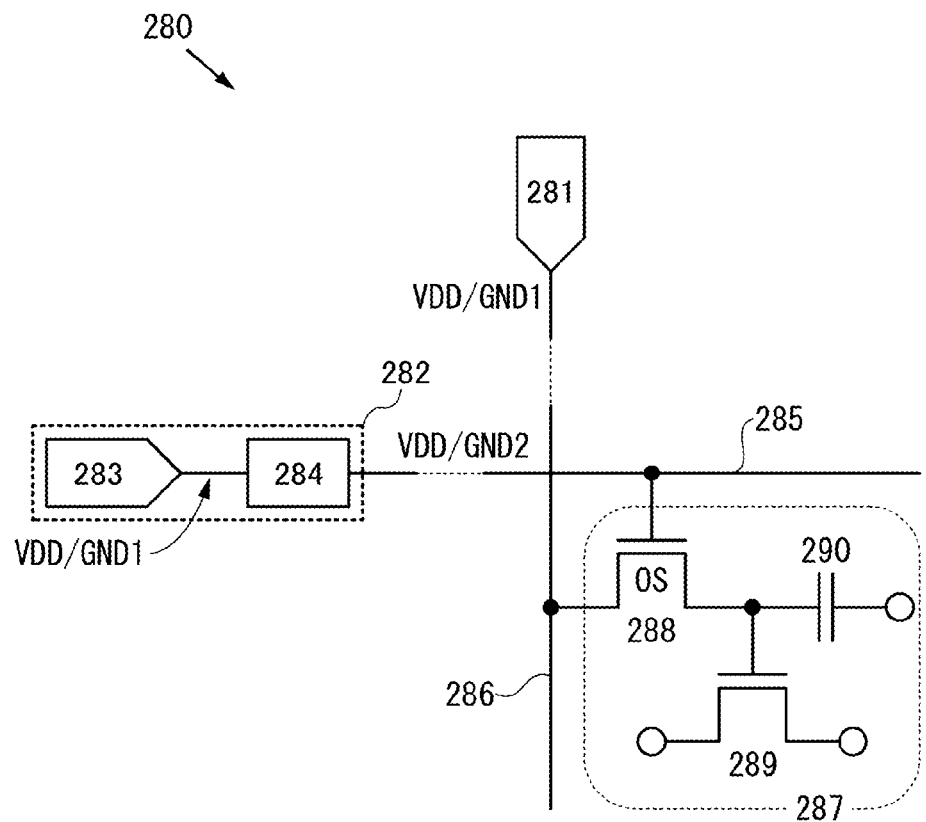
FIGS. 15A and 15B illustrate usage examples of a level shifter.

A structure of a semiconductor device 280 of this embodiment is described with reference to FIGS. 15A and 15B. FIG. 15A illustrates a memory element 287 and a peripheral circuit involved. The memory element 287 includes a writing transistor 288, a reading transistor 289, and a capacitor 290. The capacitor 290 here does not necessarily need to be intentionally provided, for which parasitic capacitance between wirings, gate capacitance of the reading transistor 289, or the like can be substituted.

One of a source and a drain of the writing transistor 288 is connected to a gate of the reading transistor 289 and one electrode of the capacitor 290. A source and a drain of the reading transistor 289 and the other electrode of the capacitor 290 are connected to appropriate elements or wirings depending on a circuit in which the memory element is used.

The other of the source and the drain of the writing transistor 288 is connected to a data line 286. A signal is input to the data line 286 by a data transfer circuit 281. The potential of the signal is VDD or GND1. A gate of the writing transistor 288 is connected to a control line 285. A control signal is input to the control line 285 by a control circuit 282. The potential of the control signal is VDD or GND2.

The control circuit 282 converts a signal output from a signal generation circuit 283 having a potential of higher than or equal to GND1 and lower than or equal to VDD, into a signal having a potential of higher than or equal to GND2 and lower than or equal to VDD using the level shifter 284. Note that the level shifter 100 in Embodiment 1 can be used as the level shifter 284.

A semiconductor material such as a single-crystal silicon is preferably used for a transistor other than the writing transistor 288, that is, the transistors used for the data transfer circuit 281, the control circuit 282, and the like, the reading transistor 289, and the like.

Figure 15B:
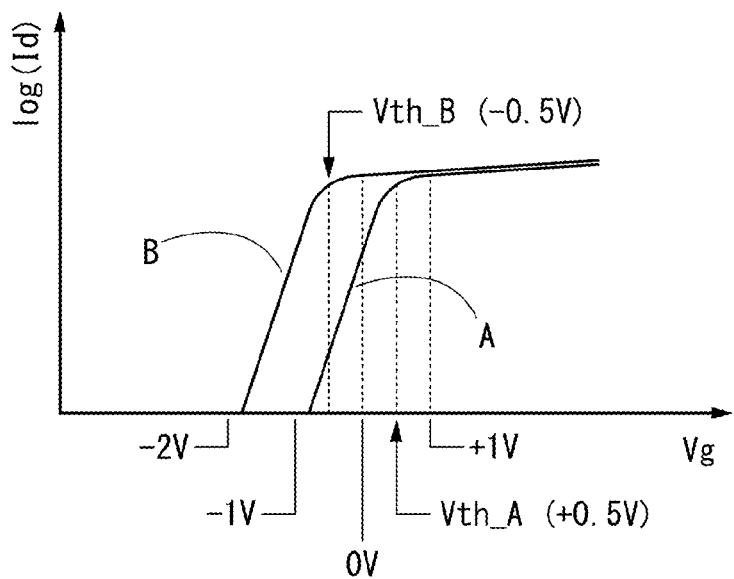

The potential sent out by the control circuit 282 is described here with reference to FIG. 15B. For example, the dependence of source-drain current ($I_d$) on gate-source voltage ($V_g$) of an n-channel transistor with a threshold voltage of +0.5 V is shown in a curved line A in FIG. 15B (note that "potential of the drain">"potential of the source"=0V). When $V_g$ is higher than or equal to $V_{th\_A}$, $I_d$ is large and the transistor is turned on. On the other hand, in a region where $V_g$ is lower than the threshold voltage $V_{th\_A}$, $I_d$ exponentially decreases as $V_g$ decreases, and the transistor is turned off. This region is referred to as subthreshold region.

Similarly, the dependence of source-drain current ($I_d$) on gate-source voltage ($V_g$) of an N-channel transistor with a threshold voltage of −0.5 V is shown in a curved line B in FIG. 15B.

Note that the threshold voltage of a transistor formed using an oxide semiconductor can be changed depending on the work function of a material used for a gate. The threshold voltage of a sufficiently long-channel transistor having an intrinsic semiconductor layer with a thickness of 30 nm or less and a gate insulating film with an equivalent oxide thickness of 30 nm or less is roughly determined by the electron affinity of the semiconductor and the work function of the gate. For example, when the electron affinity of the semiconductor is 4.6 eV and the work function of the gate is 5.1 eV, the threshold voltage is about +0.5 V. Furthermore, for example, in the case of a material having a work function of 4.1 eV (e.g., aluminum), the threshold voltage is about −0.5 V.

The length of time the writing transistor 288 is required to hold data is generally from 1 second to 10 years, although it depends on application. In addition, data writing is preferably performed in a period of 100 ps to 10 ns. Under such conditions, the ratio of necessary off-state resistance to necessary on-state resistance ("necessary off-state resistance"/"necessary on-state resistance"; on-off ratio) is $10^{12}$ to $10^{22}$, typically $10^{14}$ to $10^{22}$. Needless to say, the higher the on-off ratio is, the better. For example, the on-off ratio can be higher than or equal to $10^{12}$, typically higher than or equal to $10^{14}$. Note that, as described later, there is a need to increase the amplitude of gate-source voltage in order to increase the on-off ratio and voltage is increased, to which attention needs to be paid.

In general, considering a change in $I_d$ in the subthreshold region, a tenfold decrease in $I_d$ requires a decrease in $V_g$ by 60 mV at room temperature (25° C.) for an ideal insulated gate transistor. $V_g$ needs to decrease more if there is an influence of a trap level or the like of the gate insulating film or a short-channel effect.

Also, $V_g$ needs to be decreased more if an environmental temperature is increased. This tendency is proportional to absolute temperature in an ideal insulating gate transistor; for example, at 95° C., a tenfold decrease in $I_d$ needs $V_g$ to decrease by 73 mV.

In consideration of the above, for example, to change $I_d$ by 14 orders of magnitude (to reach 14-digits on-off ratio), $V_g$ is required to change by 0.84 V at room temperature or by 1.02 V at 95° C. for an ideal transistor. An actual transistor, for which variation in threshold voltage among transistors and the like should be taken into consideration, requires a larger change than an ideal one. For example, the potential of the gate is required to change by 1 V to 1.5 V at room temperature or by 1.2 V to 1.8 V at 95° C.

The memory element is not necessarily used at room temperature; therefore, in order to sufficiently turn off the transistor, the potential of the gate needs to be held at, for example, a potential about 1.5 V lower than the sum of the low potential and the threshold voltage. For example, when the low potential is 0 V, in the case of using the transistor whose threshold voltage shown in the curved line A is +0.5 V, the potential of the gate is preferably −1 V. On the other hand, in the case of using the transistor whose threshold voltage shown in the curved line B is −0.5 V, the potential of the gate is preferably −2 V. For example, in the case of using a transistor whose threshold voltage is +2 V, the potential of the gate is preferably 0 V.

However, in the case where the threshold voltage is dependent on the work function of the gate and the electron affinity of the semiconductor, the threshold voltage is limited. For example, it is difficult to increase the work function of the gate to higher than 6 eV, and it is also difficult to decrease the electron affinity of the semiconductor to lower than 4 eV. Thus, combination of the material of a gate and a semiconductor to achieve the threshold voltage of +2 V is not easily found.

On the other hand, in order to turn on the writing transistor 288 to write data to the capacitor 290, the potential of the gate of the writing transistor 288 needs to be higher than the sum of the potential of the capacitor 290 and the threshold voltage of the writing transistor 288.

For example, the case where the potential of the capacitor 290 is 0 V or +1 V is described. In either case, in order to obtain sufficient writing characteristics, the potential of the gate is preferably set to +1.5 V or higher when a transistor whose threshold voltage is +0.5 V is used. The potential needs to be further increased by approximately 0.5 V to sufficiently decrease the on-state resistance of the transistor in practice. For example, the potential is preferably set to +2 V. On the other hand, in the case of using the transistor whose threshold voltage shown in the curved line B is −0.5 V, the potential of the gate is preferably +1 V, which is lower than the threshold voltage by 1 V.

In other words, in the case of using the transistor whose threshold voltage is +0.5 V, a total of four potentials, other than two potentials of +1 V and 0 V for writing data, a potential of +2 V for turning on the writing transistor 288 and a potential of −1 V for turning off the writing transistor 288, are needed for a circuit including the memory element.

On the other hand, in the case of using the transistor whose threshold voltage is −0.5 V, only three potentials, +1 V (VDD), 0 V (GND1), and a potential of −2 V (GND2) for turning off the writing transistor 288, are needed.

(Embodiment 4)

DRAM is an example of a semiconductor device which needs three or more power supply potentials. For example, in order to increase on-state current of a cell transistor, the amplitude of a signal of a word line needs to be larger than the amplitude of a signal of a bit line. The amplitude of a signal other than the signal of the word line is preferably small for reducing power consumption.

Figure 16A:
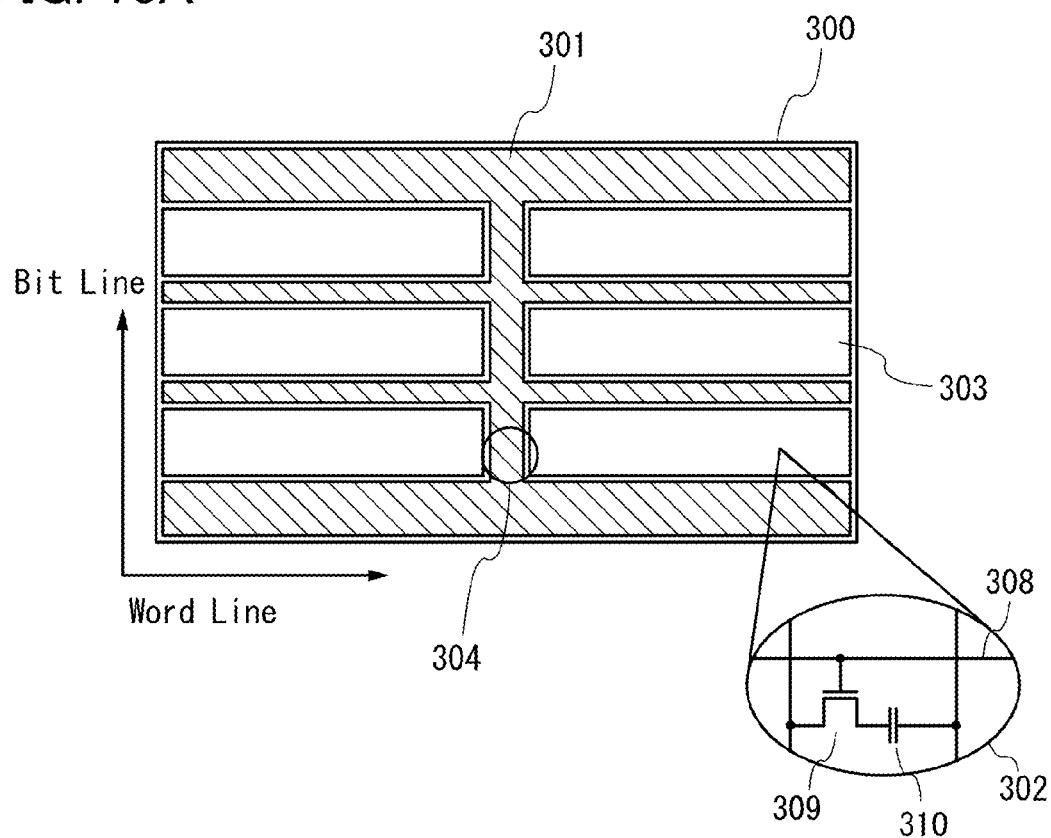
FIGS. 16A and 16B illustrate usage examples of a level shifter.

In the DRAM (or a semiconductor device which requires operation equivalent to that of the DRAM), the level shifter and the operating method described in Embodiment 1 or 2 can be used. FIG. 16A is a structure example of a DRAM chip 300. The DRAM chip 300 includes a driver region 301 and a memory region 303 including a plurality of memory cells 302. Each memory cell includes a cell transistor 309 and a capacitor 310.

Figure 16B:
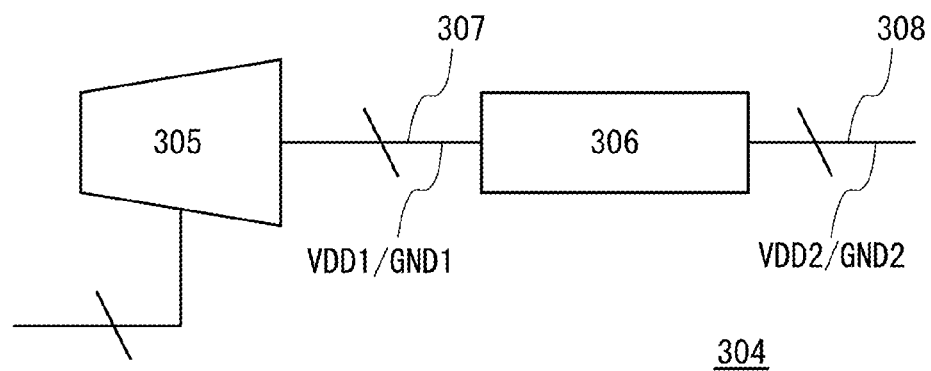

A circuit configuration of part of a region (part of a word line driver 304) of the driver region 301 in FIG. 16A is shown in FIG. 16B. The word line driver includes a decoder 305 and a level shifter unit 306 composed of the level shifters in Embodiment 2. The number of the level shifters is the same as the number of the word lines. A signal is sent from the decoder 305 to a plurality of wirings 307. The amplitude of the signal is VDD1-GND1. The signal is input from the wiring 307 to the level shifter unit 306, is converted to a signal having larger amplitude in the level shifter unit 306, and is output to the word line 308. The amplitude of the signal output to the word line 308 is VDD2-GND2 (GND2<GND1<VDD1<VDD2).

As described above, by increasing the amplitude of the signal of the word line, the on-state current of the cell transistor 309 can be increased in the DRAM. Further, in order to reduce refresh rate in the DRAM, capacitance accumulated in the capacitor 310 needs to be held for a long time. For this reason, the off-state current of the cell transistor 309 is preferably reduced.

In recent years, the threshold voltage of a transistor tends to be decreased with voltage reduction in a logic circuit, and drain current (Icut current) when a gate-source voltage is 0 V tends to be increased. For example when the threshold voltage is decreased by 0.2 V, Icut current is increased by approximately 1,000 times at a room temperature. In other words, when a gate-source voltage of the cell transistor 309 is 0 V, the ability of the capacitor 310 to hold electric charge significantly deteriorates.

Here, a gate-source voltage of the cell transistor 309 is decreased by 0.2 V, so that the ability of the capacitor 310 to hold electric charge can be maintained. Further, a gate-source voltage is decreased by more than 0.2 V, the ability can be improved. To achieve this, the potential of GND2 is applied to the gate of the cell transistor 309. In other words, the amplitude of the signal of the word line 308 is set VDD2-GND2, so that a high on-state current and a sufficiently low off-state current can be obtained. For example, a difference between the potential GND1 and the potential GND2 is preferably more than or equal to 0.5 V and less than or equal to 2 V.

Although a channel of the cell transistor 309 is formed using silicon in general, other semiconductor materials can be used. For example, in a transistor using an oxide semiconductor, a gate-source voltage needs to be lower than 0 V (e.g., −0.5 V or less; the potential of the source is higher than the potential of the gate by 0.5 V or more) to obtain sufficient off-state characteristics as described in Embodiment 3. GND2 may be used as the potential to turn off the transistor using an oxide semiconductor.

(Embodiment 5)

Figure 17:
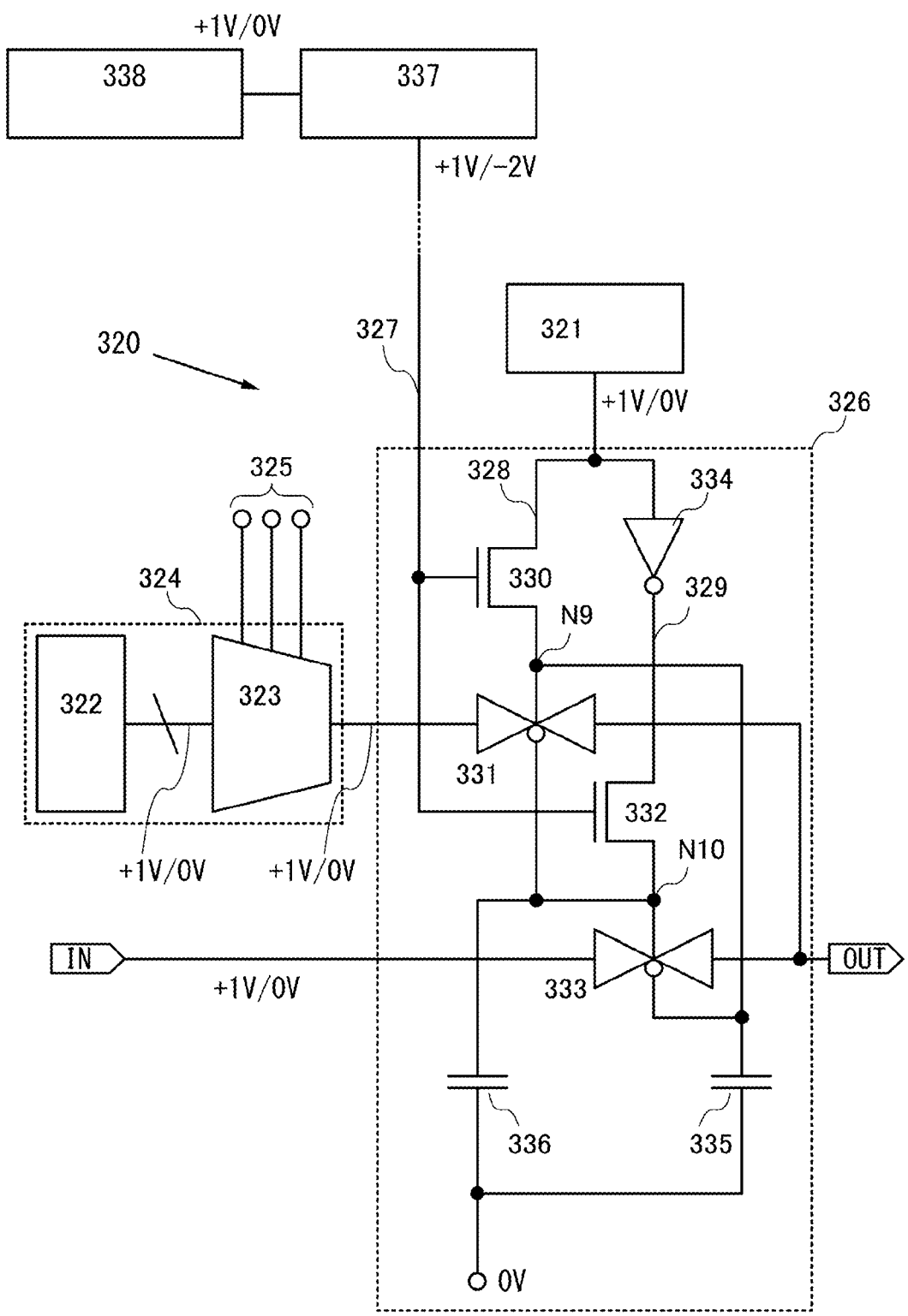
FIG. 17 illustrates a usage example of a level shifter.

FIG. 17 shows the level shifter described in Embodiment 1 or 2, a programmable logic device in which the driving method of the level shifter can be used, and a logic element 320 included in the programmable logic device.

The logic element 320 includes at least a memory 321, a lookup tale 324, and a switch 326.

The switch 326 can be regarded as a one-input multiplexer and includes at least a transistor 330, a transmission gate 331, a transistor 332, a transmission gate 333, and an inverter 334. The switch 326 may include a capacitor 335 and a capacitor 336.

The lookup table 324 includes at least a memory 322 and a multiplexer 323. The memory 322 stores configuration data (a first configuration data). A plurality of signals 325 is input to the multiplexer 323. The memory 322 and the multiplexer 323 are connected by a plurality of wirings. In general, when the multiplexer 323 has 3 inputs, the memory 322 is 8 bit or less.

The multiplexer 323 selects data from the memory 322 and outputs a signal to the switch 326. Note that in addition to the signal from the lookup table 324, a signal IN from other circuits is also input to the switch 326. The switch 326 outputs the signal IN or the signal from the lookup table 324 as a signal OUT.

The memory 321 sends data to the switch 326. The memory 321 also stores configuration data (a second configuration data). Part of the outputs of the memory 321 is input to the transistor 330 via a signal line 328, and the other is input to the transistor 332 via the inverter 334 and an inversion signal line 329.

In the switch 326, one of the transmission gates 331 and 333 is in a conduction state, and the other is in a non-conduction state in accordance with the second configuration data. In the case where the transmission gate 331 is in a conduction state, the data of the lookup table 324 is output as the signal OUT. In the case where the transmission gate 333 is in a conduction state, the signal IN is output as the signal OUT.

Note that potentials of a signal of the memory 321 and the output, a potential of a signal of the lookup table 324 and the output, and a potential of the signal IN have an amplitude of 1 V (a high potential: +1 V, a low potential: 0 V). Thus, the potential of the signal OUT also has a high potential of +1 V and a low potential of 0 V.

Next, the transistors 330 and 332 included in the switch 326 are described. A power supply line 327 is electrically connected to a gate of the transistor 330 and a gate of the transistor 332. A pulse with an amplitude of 3 V (a high potential: +1 V, a low potential: −2 V), which is converted by the level shifter 337, is applied to the power supply line 327, whereby the transistors 330 and 332 are controlled. Note that the pulse with an amplitude of 3 V is obtained by converting a pulse with an amplitude of 1 V (a high potential: +1 V, a low potential: 0 V), which is generated in a signal generator 338.

One of a source and a drain of the transistor 330 is electrically connected to the signal line 328. The other of the source and the drain of the transistor 330 is electrically connected to one control terminal of the transmission gate 331 and one electrode of the capacitor 335. An input terminal of the transmission gate 331 is electrically connected to an output of the lookup table 324. When the transmission gate 331 is in a conduction state, the signal OUT is output from the output terminal of the transmission gate 331 as the output of the switch 326.

One of a source and a drain of the transistor 332 is electrically connected to the inversion signal line 329. The other of the source and the drain of the transistor 332 is electrically connected to one control terminal of the transmission gate 333 and one of electrodes of the capacitor 336. The signal IN is input to an input terminal of the transmission gate 333. When the transmission gate 333 is in a conduction state, the signal OUT is output from the output terminal of the transmission gate 333 as the output of the switch 326.

Note that an output terminal of the transmission gate 333 is electrically connected to the output terminal of the transmission gate 331. The other of the source and the drain of the transistor 330 is electrically connected to the other control terminal of the transmission gate 333. The other of the source and the drain of the transistor 332 is electrically connected to the other control terminal of the transmission gate 331. The other electrode of the capacitor 335 and the other electrode of the capacitor 336 are held at appropriate potentials (e.g., 0 V).

The transistor 330, the transmission gate 331, the transistor 332, the transmission gate 333, and the inverter 334 which are included in the logic element 320 can be formed using a variety of materials.

As described in Embodiment 3, in the case where an oxide semiconductor layer includes a channel formation region in the transistor, an effect of extremely low off-state current of the transistor can be obtained. In addition, as described in Embodiment 3, the threshold voltage of the transistors 330 and 332 is decreased to lower than 0 V, the logic element 320 can be driven with three potentials.

The logic element 320 may further include another circuit element such as a transistor, a diode, a resistor, a capacitor, or an inductor, as appropriate. In addition, the amplitude of a signal applied to elements other than the transistors 330 and 332 is set to, for example, 1 V (a high potential: +1 V, a low potential: 0 V), so that power consumption can be reduced.

In the logic element 320, in the case where the second configuration data is "1", one of the transmission gates 331 and 333 can be in a conduction state, and the other can be in a non-conduction state. In the case where the second configuration data is "0", they are reversed.

For example, the case where the second configuration data is "1", the transmission gate 331 is in a conduction state, and the transmission gate 333 is in a non-conduction state is assumed. At first, the potential of the power supply line 327 is set to +1 V to turn on the transistors 330 and 332. Further, the potential of the signal line 328 is set to +1 V, and then, the potential of the inversion signal line 329 is automatically 0 V. Therefore, the potentials of the node N9 and the node N10 are +1 V and 0 V, respectively.

After that, the potential of the power supply line 327 is changed to −2 V, so that the transistors 330 and 332 are turned off. Thus, the potentials of the node N9 and the node N10 can be held for a certain period. The period during which the potentials of the nodes can be held depends on the size of the off-state resistances of the transistors 330 and 332.

In the above period, the transmission gate 331 is in a conduction state and the transmission gate 333 is in a non-conduction state. In other words, between two data input to the switch 326, not the signal IN, but the data from the lookup table 324 is output as the signal OUT.

Figure 18:
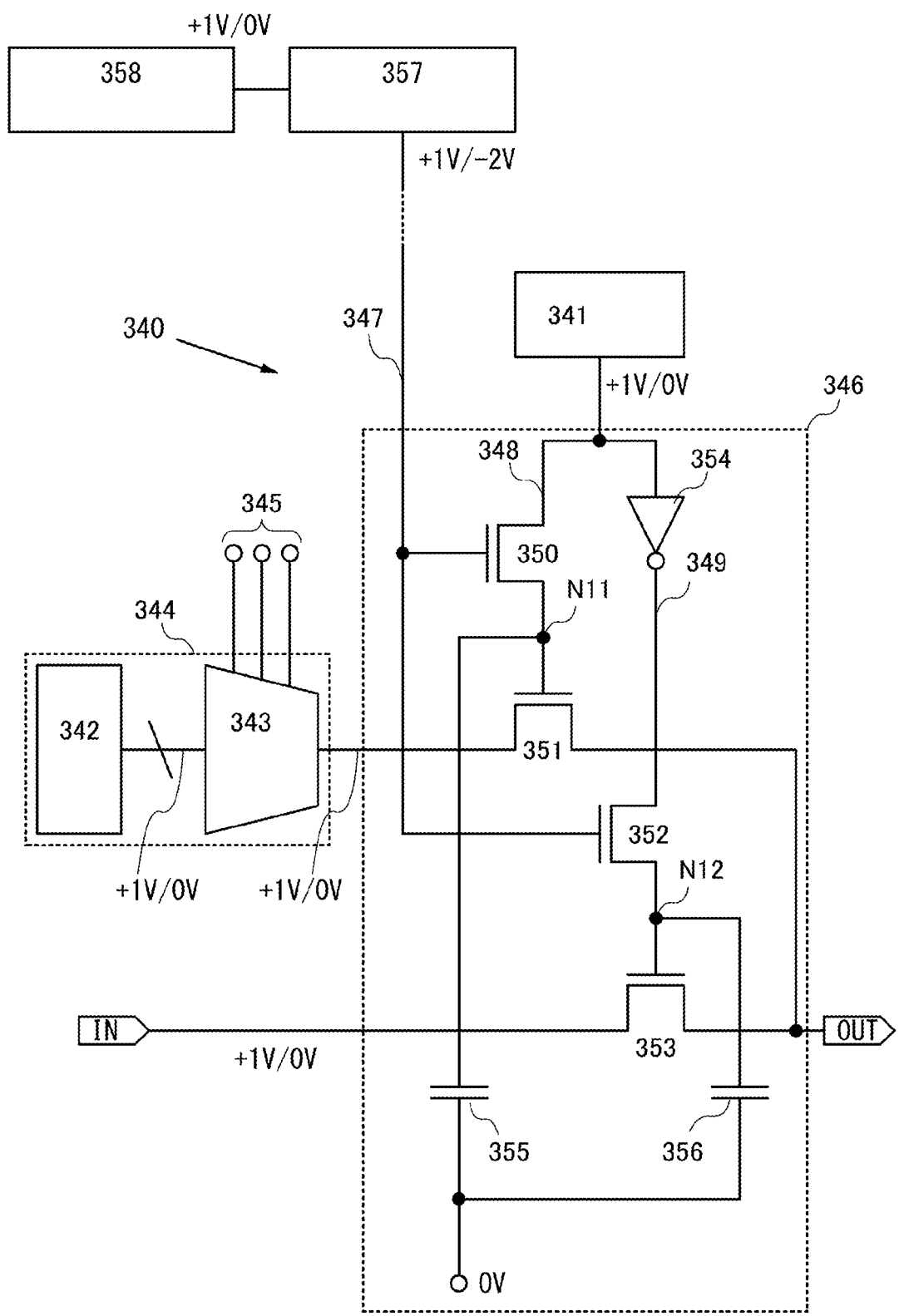
FIG. 18 illustrates a usage example of a level shifter.

FIG. 18 shows the level shifter described in Embodiment 1 or 2, a programmable logic device in which the driving method of the level shifter can be used, and a logic element 340 included in the programmable logic device. The logic element 340 includes at least a memory 341, a lookup tale 344, and a switch 346.

The switch 346 can includes at least a transistor 350, a transmission gate 351, a transistor 352, a transmission gate 353, and an inverter 354. The switch 346 may include a capacitor 355 and a capacitor 356. Although the transistors 351 and 353 may be either an N-channel transistor or a P-channel transistor, the case of the N-channel transistors 351 and 353 is described below. In addition, as the capacitors 355 and 356, a capacitor which is not intentionally provided (e.g., parasitic capacitor) may be used.

The lookup table 344 includes at least a memory 342 and a multiplexer 343. The memory 342 stores a first configuration data. A plurality of signals 345 is input to the multiplexer 343. The memory 342 and the multiplexer 343 are connected by a plurality of wirings.

The multiplexer 343 selects data from the memory 342 and outputs a signal to the switch 346. Note that in addition to the signal from the lookup table 344, a signal IN from other circuits is also input to the switch 346. The switch 346 outputs the signal IN or the signal from the lookup table 344 as a signal OUT.

The memory 341 sends data to the switch 346. The memory 341 also stores a second configuration data. Part of the outputs of the memory 341 is input to the transistor 350 via a signal line 348, and the other is input to the transistor 352 via the inverter 354 and an inversion signal line 349.

In the switch 346, one of the transistors 351 and 353 is in a conduction state, and the other is in a non-conduction state in accordance with the second configuration data. In the case where the transistor 351 is in a conduction state, the data of the lookup table 344 is output as the signal OUT. In the case where the transistor 353 is in a conduction state, the signal IN is output as the signal OUT.

Note that potentials of a signal of the memory 341 and the output, a potential of a signal of the lookup table 344 and the output, and a potential of the signal IN have an amplitude of 1 V (a high potential: +1 V, a low potential: 0 V). Thus, the potential of the signal OUT also has a high potential of +1 V and a low potential of 0 V.

Next, the transistors 350 and 352 included in the switch 346 are described. A power supply line 347 is electrically connected to a gate of the transistor 350 and a gate of the transistor 352. A pulse with an amplitude of 3 V (a high potential: +1 V, a low potential: −2 V), which is converted by the level shifter 357, is applied to the power supply line 347, whereby the transistors 350 and 352 are controlled. Note that the pulse with an amplitude of 3 V is obtained by converting a pulse with an amplitude of 1 V (a high potential: +1 V, a low potential: 0 V), which is generated in a signal generator 358.

One of a source and a drain of the transistor 350 is electrically connected to the signal line 348. The other of the source and the drain of the transistor 350 is electrically connected to one control terminal of the transmission gate 351 and one electrode of the capacitor 355. An input terminal of the transistor 351 is electrically connected to an output of the lookup table 344. When the transistor 351 is in a conduction state, the signal OUT is output from the output terminal of the transistor 351 as the output of the switch 346.

One of a source and a drain of the transistor 352 is electrically connected to the inversion signal line 349. The other of the source and the drain of the transistor 352 is electrically connected to one control terminal of the transistor 353 and one of electrodes of the capacitor 356. The signal IN is input to an input terminal of the transistor 353. When the transistor 353 is in a conduction state, the signal OUT is output from the output terminal of the transistor 353 as the output of the switch 346.

Note that the other of the source and the drain of the transistor 353 is also electrically connected to the other of the source and the drain of the transistor 351. The other electrode of the capacitor 355 and the other electrode of the capacitor 356 are held at appropriate potentials (e.g., 0 V).

The transistor 350, the transistor 351, the transistor 352, the transistor 353, and the inverter 354 which are included in the logic element 340 can be formed using a variety of materials. In the case where an oxide semiconductor layer includes a channel formation region in the transistor, an effect of extremely low off-state current of the transistor can be obtained. In addition, as in the logic element 320, the threshold voltage of the transistor 352 is decreased to lower than 0 V, the logic element 340 can be driven with three potentials.

The logic element 340 may further include another circuit element such as a transistor, a diode, a resistor, a capacitor, or an inductor, as appropriate. In addition, the amplitude of a signal applied to elements other than the transistors 350 and 352 is set to, for example, 1 V (a high potential: +1 V, a low potential: 0 V), so that power consumption can be reduced.

In the logic element 340, in the case where the second configuration data is "1", one of the transistors 351 and 353 can be in a conduction state, and the other can be in a non-conduction state. In the case where the second configuration data is "0", they are reversed.

For example, the case where the second configuration data is "1", the transistor 351 is in a conduction state, and the transistor 353 is in a non-conduction state is assumed. At first, the potential of the power supply line 347 is set to +1 V to turn on the transistors 350 and 352. Further, the potential of the signal line 348 is set to +1 V, and then, the potential of the inversion signal line 349 is automatically 0 V. Therefore, the potentials of the node N11 and the node N12 are +1 V and 0 V, respectively.

Note that at least the potentials of the source and the drain of the transistor 351 are set to 0 V at this time. Further, the potentials of the source and the drain of the transistor 353 may be 0 V.

After that, the potential of the power supply line 347 is changed to −2 V, so that the transistors 350 and 352 are turned off. Thus, the potentials of the node N11 and the node N12 can be held for a certain period. The period during which the potentials of the nodes can be held depends on the size of the off-state resistances of the transistors 350 and 352.

Because the transistor 353 is OFF, the signal IN does not serve substantially as the output signal OUT of the switch 346, and a signal from the lookup table 344 serves as the output signal OUT of the switch 346.

When a potential of 0 V is input from the lookup table 344 to the switch 346, for example, a signal whose potential is 0 V is output from the other of the source and the drain of the transistor 351 because the transistor 351 is ON.

Next, the case where a signal whose potential is +1 V is input from the lookup table 344 to the switch 346 is described, for example. In that case, the potential output from the other of the source and the drain of the transistor 351 becomes either smaller one of $1 - V_{th} + C_{351}/(C_{351} + C_{355})$ or +1 V. Here, $V_{th}$ is the threshold voltage of the transistor 351 and higher than 0 V and lower than +1 V. $C_{351}$ is a gate capacitance of the transistor 351 (which is turned on). $C_{351}$ is a capacitance of the capacitor 355.

Depending on the ratio of the gate capacitance of the transistor 351 to the capacitance of the capacitor 355 or depending on the threshold voltage of the transistor 351, the potential output from the other of the source and the drain of the transistor 351 can be +1 V or lower than +1 V. Although capacitance other than the above is not considered here, in practice, the output potential may be different from a value which can be given by the above equation due to parasitic capacitance not shown in the figures.

As an extreme case, in the case where the gate capacitance of the transistor 351 is extremely smaller than the capacitor 355, the potential can approximate to $1 - V_{th}$. In the case where the gate capacitance of the transistor 351 is extremely larger than the capacitor 355, the potential is +1 V. In the case where the gate capacitance of the transistor 351 is equal to the capacitor 355 and the threshold voltage of the transistor 351 is 0.5 V or lower, the potential output from the other of the source and the drain of the transistor 351 is +1 V.

Next, an oxide semiconductor which can be used for the transistors 330, 332, 350, and 352 is described.

An oxide semiconductor containing indium has high carrier mobility (electron mobility). An oxide semiconductor preferably contains an element M. The element M is aluminum, gallium, yttrium, or tin, for example. The element M is an element having a high bonding energy with oxygen, for example. The element M increases the energy gap of the oxide semiconductor, for example. Further, the oxide semiconductor preferably contains zinc. When containing zinc, the oxide semiconductor is likely to be crystalline. The energy at the top of the valence band (Ev) of the oxide semiconductor can be controlled by, for example, the atomic ratio of zinc, in some cases.

The oxide semiconductor does not necessarily contain indium. The oxide semiconductor may be, for example, Zn—Sn oxide or Ga—Sn oxide.

The oxide semiconductor may be In-M-Zn oxide having any of the following atomic ratios of In to M, when Zn and O are not taken into consideration: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %. Further, the oxide semiconductor may be In-M-Zn oxide having any of the following atomic ratios of In to M, when Zn and O are not taken into consideration: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a semimetal element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities to the oxide. Accordingly, the concentration of impurities in an adjacent layer is preferably reduced.

In some cases, silicon in an oxide semiconductor forms impurity states. Further, in some cases, silicon at the surface of an oxide semiconductor forms impurity states. The concentration of silicon in an oxide semiconductor or at the surface of an oxide semiconductor measured by secondary ion mass spectrometry (SIMS) is lower than $1 \times 10^{19}$ atoms/$cm^3$, more preferably lower than $5 \times 10^{18}$ atoms/$cm^3$, still more preferably lower than $2 \times 10^{18}$ atoms/$cm^3$.

Further, in some cases, hydrogen in an oxide semiconductor forms impurity states, whereby carrier density is increased. Thus, the concentration of hydrogen in the oxide semiconductor film, which is measured by SIMS, can be set to lower than or equal to $2 \times 10^{20}$ atoms/$cm^3$, preferably lower than or equal to $5 \times 10^{19}$ atoms/$cm^3$, more preferably lower than or equal to $1 \times 10^{19}$ atoms/$cm^3$, still more preferably lower than or equal to $5 \times 10^{18}$ atoms/$cm^3$. Further, in some cases, nitrogen in an oxide semiconductor forms impurity states, whereby carrier density is increased. Thus, the concentration of nitrogen in the oxide semiconductor, which is measured by SIMS, can be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, still more preferably lower than or equal to $5 \times 10^{17}$ atoms/$cm^3$.

An oxide semiconductor may include a non-single-crystal. The non-single-crystal state is, for example, structured by at least one of c-axis aligned crystal (CAAC), polycrystal, microcrystal, and an amorphous part.

An oxide semiconductor may include CAAC. Note that an oxide semiconductor including CAAC is referred to as a CAAC-OS (c-axis aligned crystalline oxide semiconductor).

In an image obtained with a transmission electron microscope (TEM), crystal parts can be found in the CAAC-OS in some cases. In most cases, in an image obtained with a TEM, crystal parts in the CAAC-OS each fit inside a cube whose one side is less than 100 nm. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, segregation of an impurity is unlikely to occur. In the CAAC-OS, since a clear boundary does not exist, high density of defect states is unlikely to occur. In the CAAC-OS, since a clear grain boundary does not exist, a reduction in electron mobility is unlikely to occur.

The CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, spots (luminescent spots) are observed in an electron diffraction pattern of the CAAC-OS in some cases. An electron diffraction pattern obtained with an electron beam having a beam diameter of 10 nmϕ or smaller, or 5 nmϕ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states. In order to form the CAAC-OS, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear and may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal. Note that an oxide semiconductor including polycrystal is referred to as a polycrystalline oxide semiconductor. A polycrystalline oxide semiconductor includes a plurality of crystal grains.

An oxide semiconductor may include microcrystal. Note that an oxide semiconductor including microcrystal is referred to as a microcrystalline oxide semiconductor.

In an image obtained with a TEM, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm is specifically referred to as nanocrystal (nc). An oxide semiconductor including nanocrystal is referred to as a nanocrystalline oxide semiconductor (nc-OS). In an image of the nc-OS obtained with a TEM, a boundary between crystal parts is not clearly detected in some cases. In an image of the nc-OS obtained with a TEM, since a clear grain boundary does not exist, segregation of an impurity is unlikely to occur. In the nc-OS, since a clear grain boundary does not exist, high density of defect states is unlikely to occur. In the nc-OS, since a clear grain boundary does not exist, for example, a reduction in electron mobility is unlikely to occur.

In the nc-OS, a macroscopic region (for example, a region with a size greater than or equal to 1 nm and less than or equal to 10 nm) has a periodic atomic order occasionally. Further, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, depending on an analysis method. When the nc-OS is analyzed by an out-of-plane method with an XRD apparatus using an X-ray having a beam diameter larger than that of a crystal part, a peak which shows alignment does not appear in some cases. Further, a halo pattern is shown in some cases in an electron diffraction pattern of the nc-OS obtained by using an electron beam having a beam diameter larger than that of a crystal part (for example, a beam diameter of 20 nmϕ or more, or 50 nmϕ or more). For example, spots are shown in some cases in a nanobeam electron diffraction pattern of the nc-OS obtained by using an electron beam having a beam diameter smaller than or equal to that of a crystal part (for example, a beam diameter of 10 nmϕ or less, or 5 nmϕ or less). In a nanobeam electron diffraction pattern of the nc-OS, regions with high luminance in a circular pattern are shown in some cases. In a nanobeam electron diffraction pattern of the nc-OS, a plurality of spots is shown in the region in some cases.

Since the macroscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

The oxide semiconductor may be a multilayer film. For example, a multilayer film in which an oxide semiconductor layer (S1) and an oxide semiconductor layer (S2) are stacked in this order may be used.

In this case, the conduction band edge (Ec) of the oxide semiconductor layer (S2) is made lower than that of the oxide semiconductor layer (S1), for example. Specifically, for the oxide semiconductor layer (S2), an oxide semiconductor having higher electron affinity than the oxide semiconductor layer (S1) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

Alternatively, the energy gap of the oxide semiconductor layer (S2) is made smaller than that of the oxide semiconductor layer (S1), for example. The energy gap can be obtained by, for example, an optical method. Specifically, for the oxide semiconductor layer (S2), an oxide semiconductor having smaller energy gap than the oxide semiconductor layer (S1) by greater than or equal to 0.1 eV and smaller than or equal to 1.2 eV or by greater than or equal to 0.2 eV and smaller than or equal to 0.8 eV is used.

Alternatively, the oxide semiconductor may be a multilayer film in which the oxide semiconductor layer (S1), the oxide semiconductor layer (S2), and an oxide semiconductor layer (S3) are formed in this order.

Alternatively, the energy (Ec) at the bottom of the conduction band of the oxide semiconductor layer (S2) is set to be lower than that of the oxide semiconductor layer (S1) and the oxide semiconductor layer (S3). Specifically, for the oxide semiconductor layer (S2), an oxide semiconductor having higher electron affinity than the oxide semiconductor layers (S1) and (S3) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

Alternatively, the energy gap of the oxide semiconductor layer (S2) may be smaller than that of each of the oxide semiconductor layers (S1) and (S3). Specifically, for the oxide semiconductor layer (S2), an oxide semiconductor having smaller energy gap than the oxide semiconductor layers (S1) and (S3) by greater than or equal to 0.1 eV and smaller than or equal to 1.2 eV or by greater than or equal to 0.2 eV and smaller than or equal to 0.8 eV is used.

To increase the on-state current of the top-gate transistor, the thickness of the oxide semiconductor layer (S3) is preferably as small as possible. For example, the thickness of the oxide semiconductor layer (S3) is less than 10 nm, preferably less than or equal to 5 nm, more preferably less than or equal to 3 nm. In contrast, the oxide semiconductor layer (S3) blocks entry of elements (e.g., silicon) other than oxygen contained in the gate insulating film to the oxide semiconductor layer (S2) having a high current density. Thus, the oxide semiconductor layer (S3) preferably has a certain thickness. For example, the thickness of the oxide semiconductor layer (S3) is greater than or equal to 0.3 nm, preferably greater than or equal to 1 nm, more preferably greater than or equal to 2 nm.

The oxide semiconductor layer (S1) is preferably formed thick. The oxide semiconductor layers (S2) and (S3) are preferably formed thin. Specifically, the thickness of the oxide semiconductor layer (S1) is greater than or equal to 20 nm, preferably greater than or equal to 30 nm, more preferably greater than or equal to 40 nm, still more preferably greater than or equal to 60 nm. Specifically, the thickness of the oxide semiconductor layer (S1) is greater than or equal to 20 nm, preferably greater than or equal to 30 nm, more preferably greater than or equal to 40 nm, still more preferably greater than or equal to 60 nm. With the oxide semiconductor layer (S1) having the above thickness, the interface between the insulating film and the oxide semiconductor layer (S1) can be separated from the oxide semiconductor layer (S2) having a high current density to have a distance greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the oxide semiconductor layer (S1) is smaller than or equal to 200 nm, preferably smaller than or equal to 120 nm, more preferably smaller than or equal to 80 nm. The thickness of the oxide semiconductor layer (S2) is greater than or equal to 3 nm and less than or equal to 100 nm, preferably greater than or equal to 3 nm and less than or equal to 80 nm, more preferably greater than or equal to 3 nm and less than or equal to 50 nm.

For example, the thickness of the oxide semiconductor layer S1 may be greater than that of the oxide semiconductor layer (S2), and the thickness of the oxide semiconductor layer (S2) may be greater than that of the oxide semiconductor layer (S3).

A single layer or a multiple layer of the above described oxide semiconductor can be used for channels of the transistor 330, the transistor 332, the transistor 350, and the transistor 352.

Note that the power supply potential used in this embodiment can have a value other than the above-described value.

(Embodiment 6)

Figure 19:
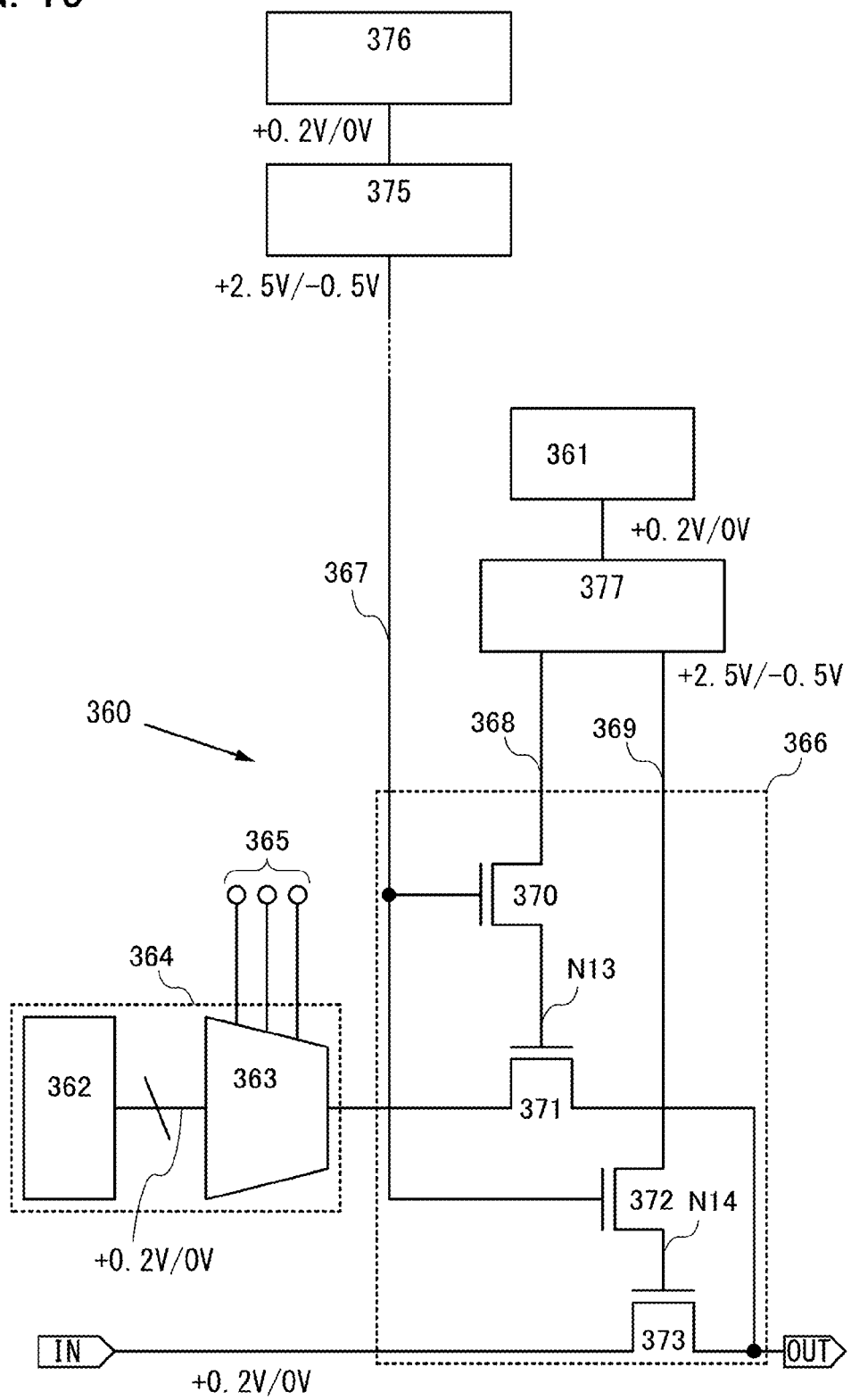
FIG. 19 illustrates a usage example of a level shifter.
Figure 20:
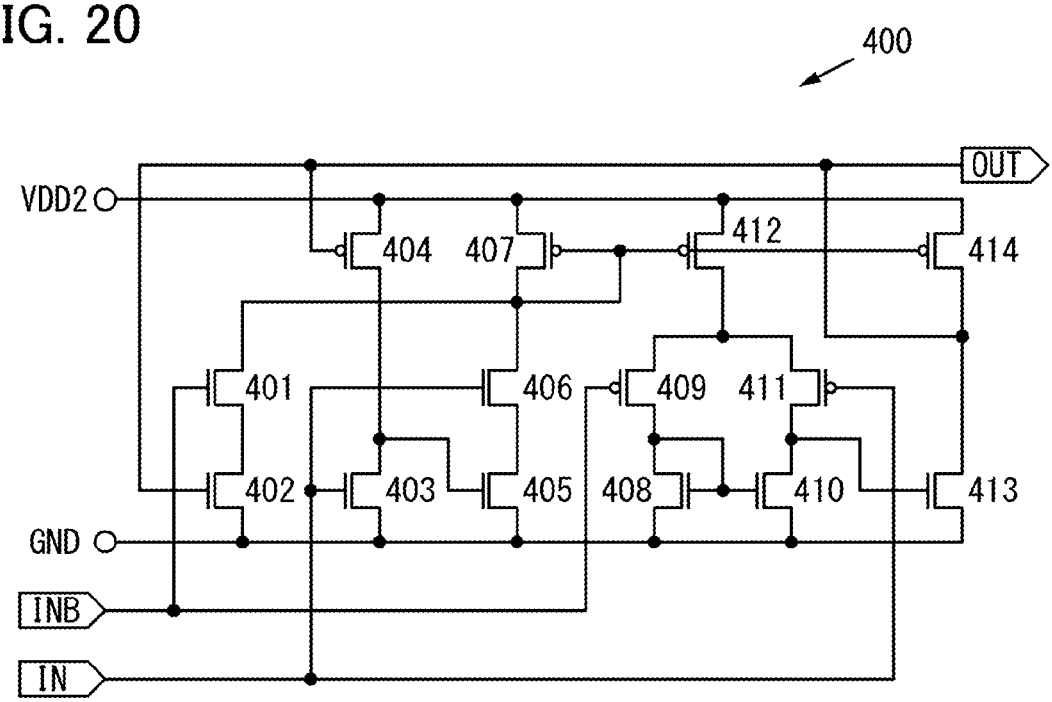
FIG. 20 illustrates a circuit example of a level shifter.

FIG. 19 shows the level shifter described in Embodiment 1 or 2, a programmable logic device in which the driving method of the level shifter can be used, and a logic element 360 included in the programmable logic device.

The logic element 360 includes at least a memory 361, a lookup tale 364, and a switch 366.

The switch 366 can includes at least transistors 370 to 373. The transistor 370 and the transistor 372 can function as selection transistors. The transistor 371 and the transistor 373 can function as path transistors.

The lookup table 364 includes at least a memory 362 and a multiplexer 363. The memory 362 stores a first configuration data. A plurality of signals 365 is input to the multiplexer 363. The memory 362 and the multiplexer 363 are connected by a plurality of wirings.

The multiplexer 363 selects data from the memory 362 and outputs a signal to the switch 366. Note that in addition to the signal from the lookup table 364, a signal IN from other circuits is also input to the switch 366. The switch 366 outputs the signal IN or the signal from the lookup table 364 as a signal OUT.

The switch 366 is electrically connected to the memory 361. The memory 361 stores the second configuration data. Note that boosting (amplification) in the memory 361 and output of the memory 361 are performed by a level shifter 377, and the output is input to the switch 366 through a signal line 368 and an inverted signal line 369. Here, a potential of a signal of the inverted signal line 369 is an inverted signal of the signal of the signal line 368. As described in Embodiment 1 or 2, an inverted signal can be obtained in the level shifter 377 at the same time.

In the switch 366, one of the transistors 371 and 373 is in a conduction state, and the other is in a non-conduction state in accordance with the second configuration data. In the case where the transistor 371 is in a conduction state, the data of the lookup table 364 is output as the signal OUT. In the case where the transistor 373 is in a conduction state, the signal IN is output as the signal OUT.

Note that potentials of a signal of the memory 361 and the output, a potential of a signal of the lookup table 364 and the output, and a potential of the signal IN have an amplitude of 0.2 V (a high potential: +0.2 V, a low potential: 0 V). Thus, the potential of the signal OUT also has a high potential of +0.2 V and a low potential of 0 V.

Next, the transistors 370 to 373 included in the switch 366 are described. A power supply line 367 is electrically connected to a gate of the transistor 370 and a gate of the transistor 372. A pulse with an amplitude of 3 V (a high potential: +2.5 V, a low potential: −0.5 V), which is boosted (amplified) by the level shifter 375, is applied to the power supply line 367, whereby the transistors 370 and 372 are controlled. Note that the pulse with an amplitude of 3 V is obtained by converting a pulse with an amplitude of 0.2 V (a high potential: +0.2 V, a low potential: 0 V), which is generated in a signal generator 376.

One of a source and a drain of the transistor 370 is electrically connected to the signal line 368. The other of the source and the drain of the transistor 370 is electrically connected to one control terminal of the transistor 371. One of a source and a drain of the transistor 371 is electrically connected to an output of the lookup table 364. The signal OUT is output from the other of the source and drain of the transistor 371 as the output of the switch 366.

One of a source and a drain of the transistor 372 is electrically connected to the inverted signal line 369. The other of the source and the drain of the transistor 372 is electrically connected to a gate of the transistor 373. The signal IN is input to one of a source and a drain of the transistor 373. The signal OUT is output from the other of the source and drain of the transistor 373 as the output of the switch 366. Note that other of the source and the drain of the transistor 373 is also electrically connected to the other of the source and the drain of the transistor 371.

The transistors 370 to 373 included in the logic element 360 can be formed using a variety of materials. In the case where an oxide semiconductor layer is used in a channel formation region of the transistor, an effect of extremely low off-state leakage current of the transistor can be obtained.

The logic element 360 may further include another circuit element such as a transistor, a diode, a resistor, a capacitor, or an inductor, as appropriate. In addition, the amplitude of a signal applied to elements other than the transistors 370 and 372 is set to, for example, 0.2 V (a high potential: +0.2 V, a low potential: 0 V), so that power consumption can be reduced.

In the logic element 360, in the case where the second configuration data is "1", one of the transistors 371 and 373 can be in a conduction state, and the other can be in a non-conduction state. In the case where the second configuration data is "0", they are reversed.

For example, the case where the second configuration data is "1", the transistor 371 is in a conduction state, and the transistor 373 is in a non-conduction state is assumed. At first, the potential of the power supply line 367 is set to +2.5 V to turn on the transistors 370 and 372. Further, the potential of the signal line 368 is set to +2.5 V, and then, the potential of the inversion signal line 369 is automatically −0.5 V.

Although both of the transistors 370 and 372 are ON, the potential of a node N13 (a gate of the transistor 371) is lower than the potential of the signal line 368 by the threshold voltage of the transistor 370. For example, when the threshold voltage of the transistor 370 is +1.1 V, the potential of the node N13 is +1.4 V.

To sufficiently decrease the on-state resistance of the transistor 371 at this potential, the threshold voltage of the transistor 371 needs to have an appropriate value. In general, a transistor whose channel is formed of silicon, the threshold voltage can be 0.3 V to 1 V. In addition, the on-state resistance can be sufficiently decreased as long as a potential of a signal input to a source and a drain of the transistor is +0.2 V at maximum.

As for a node N14 (a gate of the transistor 373), the potential is −0.5 V.

After that, the potential of the power supply line 367 is changed to −0.5 V, so that the transistors 370 and 372 are turned off. Thus, the potentials of the node N13 and the node N14 can be held for a certain period. The period during which the potentials of the nodes can be held depends on the size of the off-state resistances of the transistors 370 and 372.

In the above period, the transistor 371 is in a conduction state and the transistor 373 is in a non-conduction state. In other words, between two data input to the switch 366, not the signal IN, but the data from the lookup table 364 is output as the signal OUT.

Note that in the case where the channel formation region of the transistor 370 or 372 includes an oxide semiconductor layer, the off-state current of the transistor can be extremely low. Thus, with the use of the oxide semiconductor layer, when the transistors 370 and 372 are OFF, the potentials of the gates of the transistors 371 and 372 (the nodes N13 and N14) can be prevented from being changed for a long time.

Note that the power supply potential used in this embodiment can have a value other than the above-described value.

This application is based on Japanese Patent Application serial no. 2013-079299 filed with Japan Patent Office on Apr. 5, 2013 and no. 2013-087384 filed with Japan Patent Office on Apr. 18, 2013, the entire contents of which are hereby incorporated by reference.

What is claimed is:

1. A signal processing device comprising:
a differential amplifier circuit outputting a first signal and a second signal;
a switch electrically connected to the differential amplifier circuit; and
a current control circuit outputting a third signal for controlling the switch,
wherein the first signal and the second signal are input to the current control circuit,
wherein a first power supply line having a first potential is electrically connected to the differential amplifier circuit and the current control circuit,
wherein a second power supply line having a second potential is directly connected to the switch and the current control circuit,
wherein the second power supply line is electrically connected to the differential amplifier circuit through the switch, and
wherein the first potential is larger than the second potential.

2. The signal processing device according to claim 1, wherein the second potential is lower than a low potential of a signal which is input to the differential amplifier.

3. The signal processing device according to claim 1, wherein a signal which is input to the differential amplifier is a binary having the first potential.

4. The signal processing device according to claim 1, further comprising a latch circuit,
wherein the first signal and the second signal are input to the latch circuit.

5. The signal processing device according to claim 1,
wherein the switch is a transistor, and
wherein the third signal is applied to a gate of the transistor.

6. The signal processing device according to claim 5, wherein the transistor comprises an oxide semiconductor layer.

7. The signal processing device according to claim 6, wherein the oxide semiconductor layer comprises a c-axis aligned crystal.

8. A signal processing device comprising:
an differential amplifier circuit outputting a first signal and a second signal;
a switch electrically connected to the differential amplifier circuit; and
a current control circuit outputting a third signal for controlling the switch,
wherein the first signal and the second signal are input to the current control circuit,
wherein a first power supply line having a first potential is directly connected to the switch and the current control circuit,
wherein a second power supply line having a second potential is electrically connected to the current control circuit,
wherein a third power supply line having a third potential is electrically connected to the differential amplifier circuit,
wherein the first power supply line is electrically connected to the differential amplifier circuit through the switch,
wherein the first potential is larger than the second potential, and
wherein the second potential is larger than the third potential.

9. The signal processing device according to claim 8, wherein the first potential is larger than a high potential of a signal which is input to the differential amplifier.

10. The signal processing device according to claim 8, wherein a signal which is input to the differential amplifier is a binary signal having the second potential.

11. The signal processing device according to claim 8, further comprising a latch circuit,
   wherein the first signal and the second signal are input to the latch circuit.

12. The signal processing device according to claim 8, wherein the switch is a transistor, and
   wherein the third signal is applied to a gate of the transistor.

13. The signal processing device according to claim 12, wherein the transistor comprises an oxide semiconductor layer.

14. The signal processing device according to claim 13, wherein the oxide semiconductor layer comprises a c-axis aligned crystal.

* * * * *